(12) United States Patent
Miyata et al.

(10) Patent No.: US 9,312,403 B2
(45) Date of Patent: Apr. 12, 2016

(54) PHOTOSENSOR HAVING AN EMITTER-ENCAPSULATING PORTION, RECEIVER-ENCAPSULATING PORTION, AND CIRCUIT-ENCAPSULATING PORTION CONNECTED TO ONE ANOTHER WITH A CONDUCTIVE LEADFRAME

(71) Applicant: OMRON Corporation, Kyoto-shi, Kyoto (JP)

(72) Inventors: Tsuyoshi Miyata, Ayabe (JP); Kazuya Ohtsuki, Fukuchiyama (JP); Jun Nakajima, Ayabe (JP); Seiji Miyashita, Fukuchiyama (JP); Kiyoshi Imai, Ayabe (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 14/625,994

(22) Filed: Feb. 19, 2015

(65) Prior Publication Data

US 2015/0263186 A1 Sep. 17, 2015

(30) Foreign Application Priority Data

Mar. 15, 2014 (JP) .................................. 2014-052822
Apr. 15, 2014 (JP) .................................. 2014-083457

(51) Int. Cl.
| | | |
|---|---|---|
| H01L 31/02 | (2006.01) | |
| H01L 31/0203 | (2014.01) | |
| H01L 31/167 | (2006.01) | |
| H01L 31/0224 | (2006.01) | |
| H01L 31/14 | (2006.01) | |

(52) U.S. Cl.
CPC ........ *H01L 31/0203* (2013.01); *H01L 31/0224* (2013.01); *H01L 31/14* (2013.01); *H01L 31/167* (2013.01); *H01L 2224/05554* (2013.01); *H01L 2224/48247* (2013.01); *H01L 2224/49111* (2013.01); *H01L 2224/49171* (2013.01); *H01L 2924/181* (2013.01)

(58) Field of Classification Search
None
See application file for complete search history.

(56) References Cited

U.S. PATENT DOCUMENTS

| 4,114,177 A | * | 9/1978 | King .............................. 257/81 |
| 4,933,729 A | * | 6/1990 | Soejima et al. ................. 257/82 |
| 4,977,317 A | * | 12/1990 | Iwashima ..................... 250/239 |
| 5,655,042 A | * | 8/1997 | Atanovich et al. .............. 385/88 |

(Continued)

FOREIGN PATENT DOCUMENTS

| JP | S60-129161 A | 7/1985 |
| JP | H10-242498 A | 9/1998 |
| JP | H11-145505 A | 5/1999 |

*Primary Examiner* — Scott B Geyer
(74) *Attorney, Agent, or Firm* — Mots Law, PLLC

(57) ABSTRACT

A photosensor includes an emitter element, an emitter-encapsulating portion, a receiver element, a receiver-encapsulating portion, a circuit portion, and a circuit-encapsulating portion. The emitter-encapsulating portion encapsulates the emitter element. The receiver-encapsulating portion encapsulates the receiver element. The circuit portion includes a luminous element for indicating an operation. The circuit-encapsulating portion encapsulates the circuit portion. The circuit-encapsulating portion includes an operation indicator portion facing the luminous element. The emitter-encapsulating portion, the receiver-encapsulating portion, and the circuit-encapsulating portion are connected to one another with a conductive leadframe. The emitter-encapsulating portion, the receiver-encapsulating portion, and the circuit-encapsulating portion are formed from the same resin material containing a light diffusing agent.

8 Claims, 24 Drawing Sheets

(56) References Cited

U.S. PATENT DOCUMENTS

| | | | |
|---|---|---|---|
| 5,753,929 A * | 5/1998 | Bliss | 250/551 |
| 8,390,102 B2 * | 3/2013 | Su et al. | 257/666 |
| 2008/0210952 A1 * | 9/2008 | Wada | 257/82 |
| 2013/0200397 A1 * | 8/2013 | Biwa | 257/82 |

* cited by examiner

FIG. 1
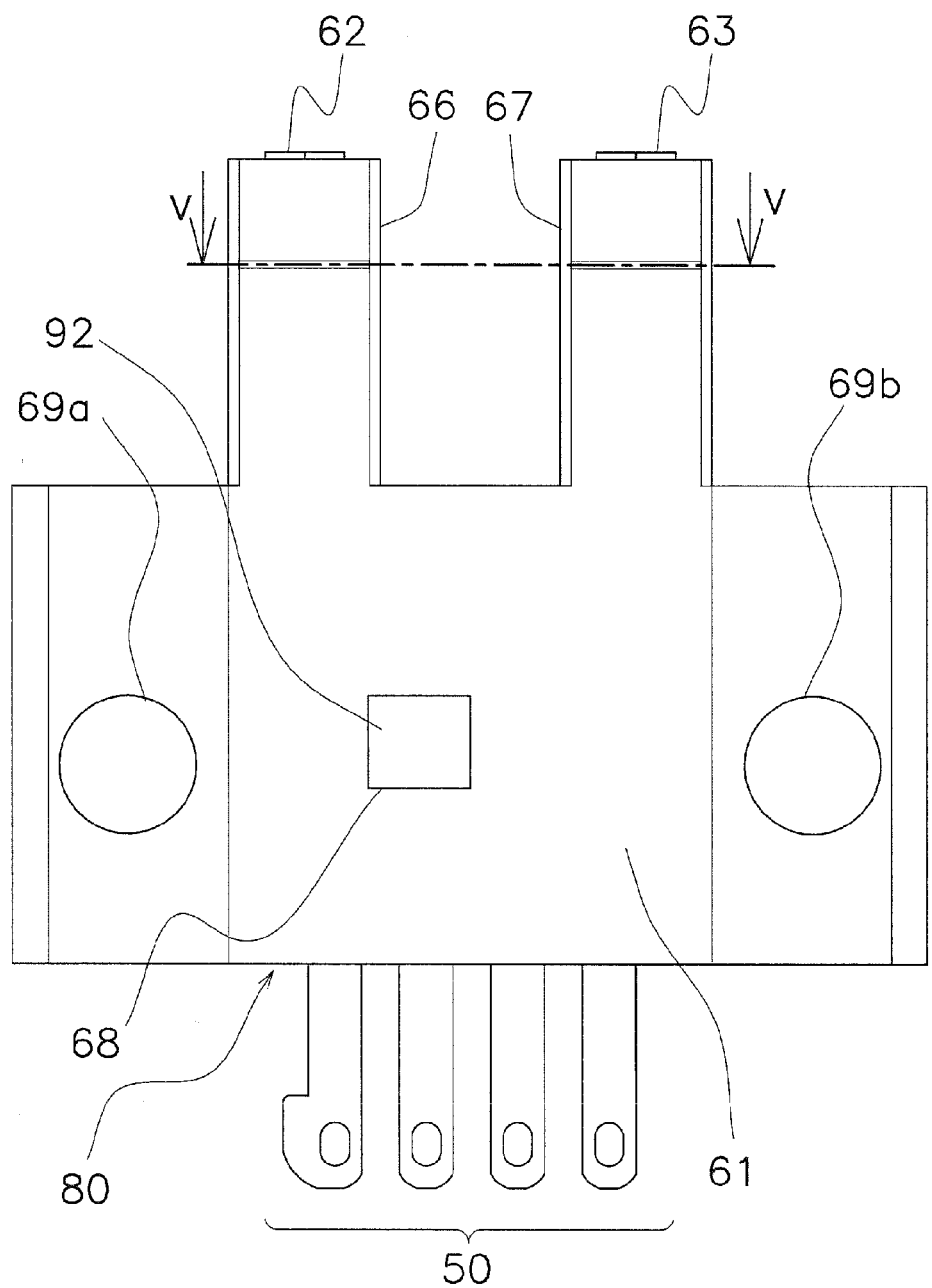
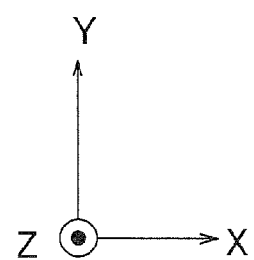

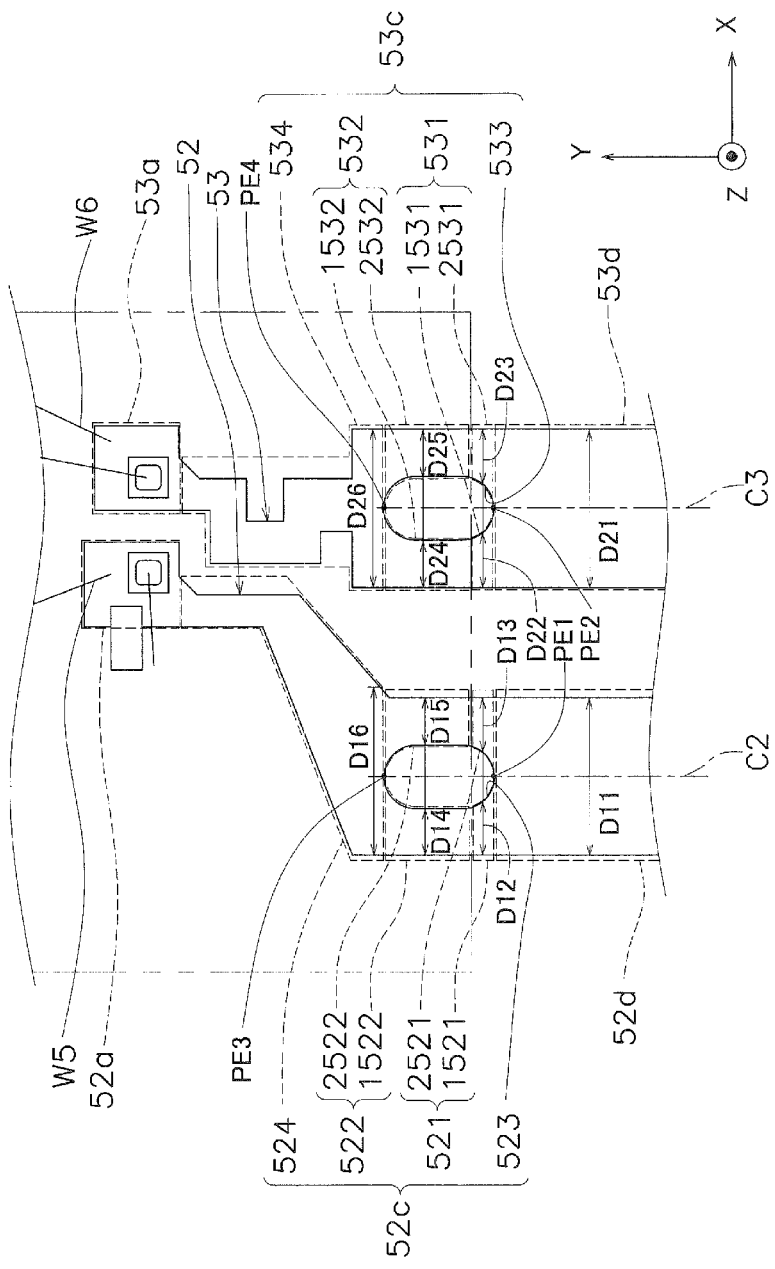

FIG. 15A
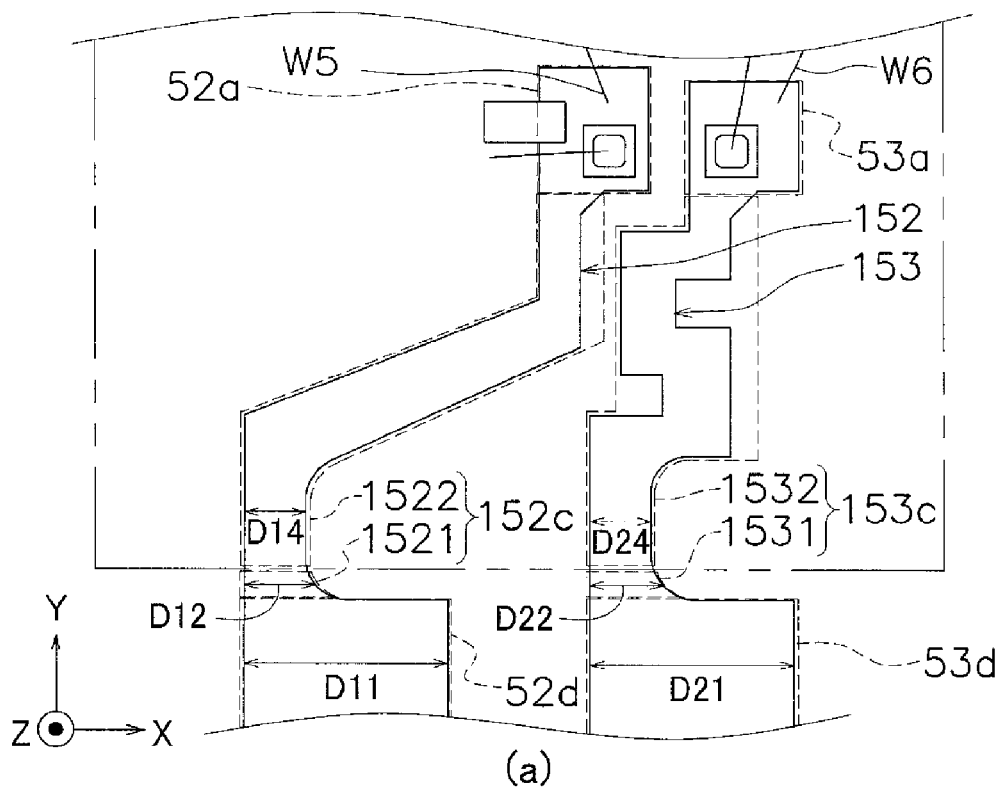
(a)
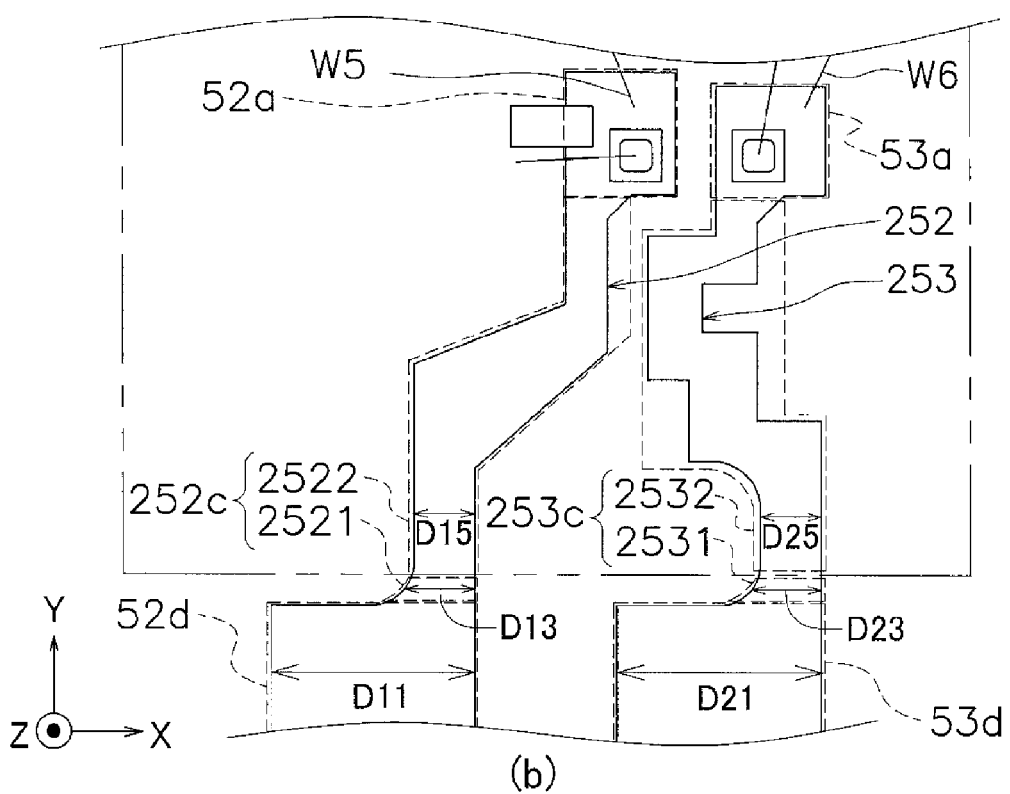
(b)

FIG. 15B
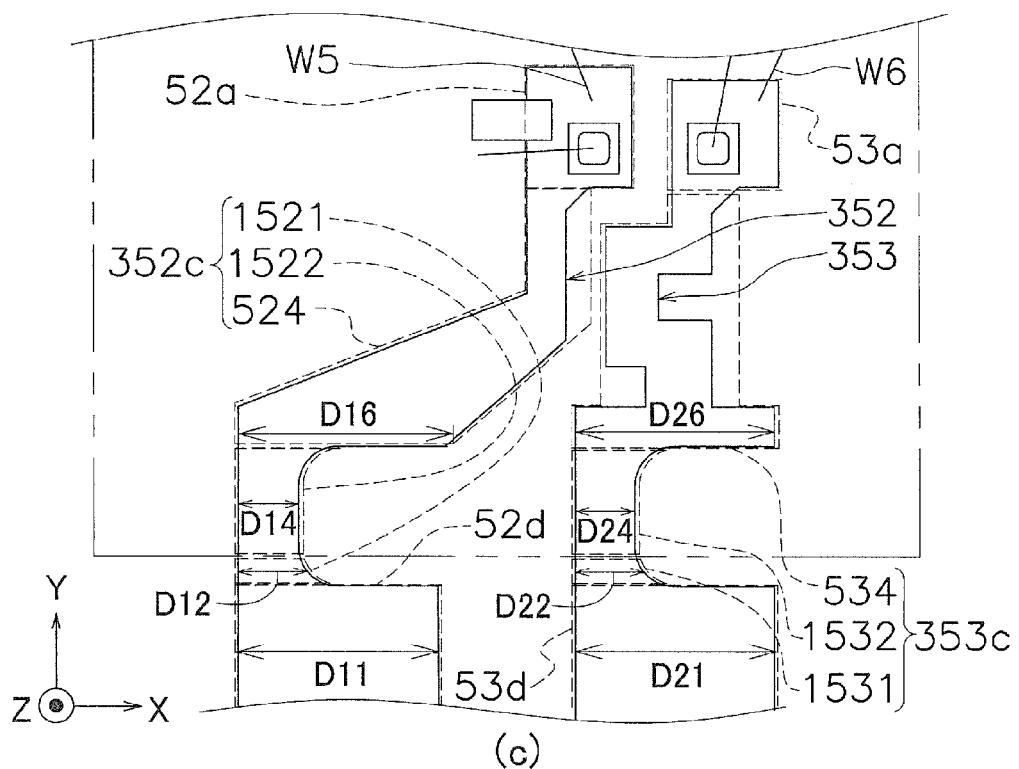
(c)
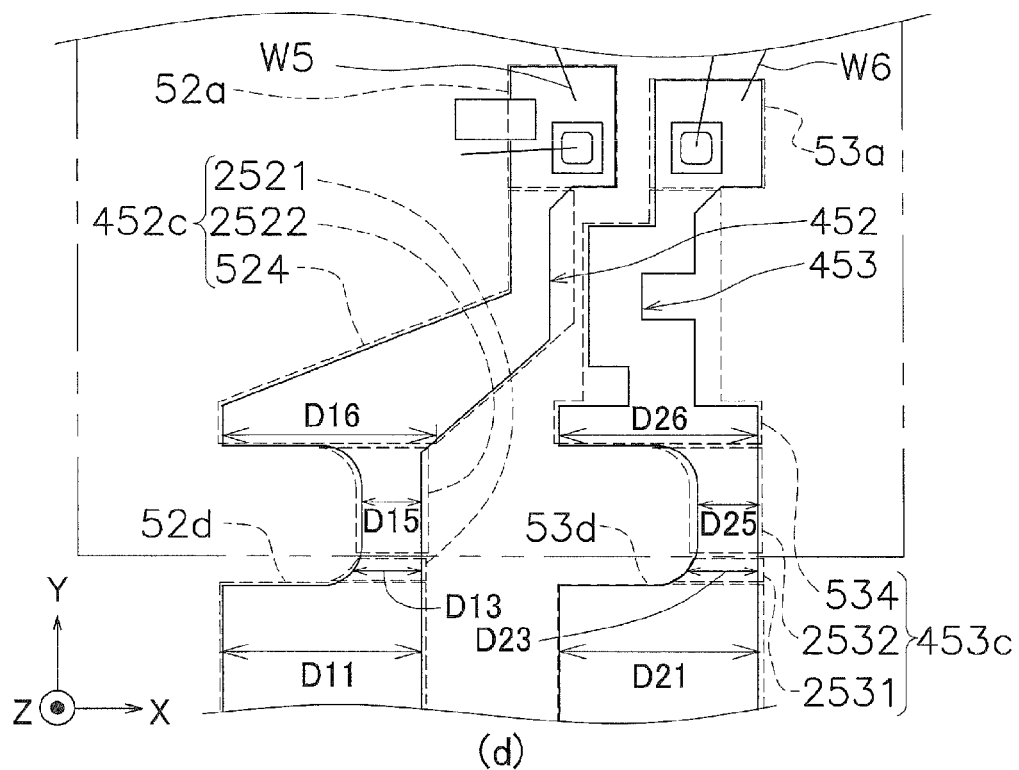
(d)

PHOTOSENSOR HAVING AN EMITTER-ENCAPSULATING PORTION, RECEIVER-ENCAPSULATING PORTION, AND CIRCUIT-ENCAPSULATING PORTION CONNECTED TO ONE ANOTHER WITH A CONDUCTIVE LEADFRAME

FIELD

The present invention relates to a photosensor.

BACKGROUND

A photosensor known in the art can achieve its function when the resin encapsulating an emitter element and a receiver element contains 10% to 30% by weight of light diffusing agent (refer to Patent Literature 1).

Patent Literature 2 describes a photosensor including an emitter element and a receiver element, and an operation indicator lamp indicating whether an object that blocks light is present between the receiver element and the emitter element. The operation indicator lamp is typically a luminous element arranged near an integrated circuit for controlling the receiver element and the emitter element. The luminous element is encapsulated with resin together with the integrated circuit.

CITATION LIST

Patent Literature

Patent Literature 1: Japanese Unexamined Utility Model Publication No. 60-129161
Patent Literature 2: Japanese Unexamined Patent Application Publication No. 11-145505

SUMMARY

Technical Problem

To increase the visibility of the operation indicator lamp, light in the luminous element may be diffused. In other words, the resin encapsulating the luminous element may contain a large amount of light diffusing agent. However, diffusion of the light from the emitter element would reduce the amount of light reaching the receiver element. If the resin encapsulating the receiver element contains a large amount of diffusing agent, the detection would be affected greatly by ambient light, which is other than the light for detection coming from the light blocking object. To avoid this, the resin encapsulating the emitter element and the receiver element may not contain a light diffusing agent. A first resin encapsulating the emitter element and the receiver element and a second resin encapsulating the luminous element forming the operation indicator lamp have different intended performances. A common approach has been to form the first resin and the second resin separately through injection molding. However, this approach uses two different resins, and complicates the molding process.

To respond to this problem, it is an object of the invention to provide a photosensor that simplifies the resin molding process for an emitter element, a receiver element, and a luminous element forming an operation indicator lamp.

Solution to Problem

A first aspect of the invention provides a photosensor including an emitter element, an emitter-encapsulating portion, a receiver element, a receiver-encapsulating portion, a circuit portion, and a circuit-encapsulating portion. The emitter-encapsulating portion encapsulates the emitter element. The receiver-encapsulating portion encapsulates the receiver element. The circuit portion includes a luminous element for indicating an operation. The circuit-encapsulating portion encapsulates the circuit portion. The circuit-encapsulating portion includes an operation indicator portion facing the luminous element. The emitter-encapsulating portion, the receiver-encapsulating portion, and the circuit-encapsulating portion are connected to one another with a conductive leadframe. The emitter-encapsulating portion, the receiver-encapsulating portion, and the circuit-encapsulating portion are formed from the same resin material containing a light diffusing agent. This structure allows the resin molding of the emitter element, the receiver element, and the luminous element forming the operation indicator lamp to be performed through a single process, thus simplifying the molding process.

It is preferred that the resin has a light transmittance of not less than 20% and not more than 60%. This allows light from the emitter element to enter the receiver element without being greatly diffused and without greatly affected by ambient light, which is other than the light for detection coming from the light blocking object. At the same time, the light from the emitter element diffuses by a degree high enough to improve visibility. The performance intended for the resin encapsulating the emitter element and the receiver element and the performance intended for the resin encapsulating the luminous element forming the operation indicator lamp are both achieved by the same resin material.

The leadframe may be formed integrally. This simplifies the molding process.

The thickness of a resin portion of the receiver-encapsulating portion covering a light receiving surface of the receiver element in a direction perpendicular to the light receiving surface may be smaller than the thickness of a resin portion of the circuit-encapsulating portion covering a luminous surface of the luminous element in a direction perpendicular to the luminous surface. In this case, light received by the receiver element diffuses by a lower degree than light emitted by the luminous element. The resin containing the same concentration of the light diffusing agent would allow more light from the emitter element to enter the receiver element and improves the visibility of the light from the luminous element.

A surface of the receiver-encapsulating portion facing the light receiving surface may include a curved surface. The thickness of a resin portion of the receiver-encapsulating portion between the light receiving surface of the receiver element and an apex of the curved surface may be smaller than the thickness of a resin portion of the circuit-encapsulating portion covering the luminous surface of the luminous element in a direction perpendicular to the luminous surface. This allows the light received by the receiver element to be focused through the receiver-encapsulating portion.

The thickness of a resin portion of the emitter-encapsulating portion covering a light emitting surface of the emitter element in a direction perpendicular to the light emitting surface may be smaller than the thickness of a resin portion of the circuit-encapsulating portion covering a luminous surface of the luminous element in a direction perpendicular to the luminous surface. The resin containing the same concentration of the light diffusing agent would allow more light from the emitter element to enter the receiver element and improves the visibility of the light from the luminous element.

A surface of the emitter-encapsulating portion facing the light emitting surface may include a curved surface. The thickness of a resin portion of the emitter-encapsulating portion between the light emitting surface of the emitting element and an apex of the curved surface may be smaller than the thickness of a resin portion of the circuit-encapsulating portion covering the luminous surface of the luminous element in a direction perpendicular to the luminous surface. This allows the light emitted by the emitter element to be focused through the emitter-encapsulating portion.

BRIEF DESCRIPTION OF THE DRAWINGS

FIG. 1 is a front view of a photosensor according to one embodiment.

FIG. 14 is an enlarged view of an area including a first inner terminal and a third inner terminal.

FIG. 15A is a diagram showing a first inner terminal and a third inner terminal according to modifications of the embodiment.

FIG. 15B is a diagram showing a first inner terminal and a third inner terminal according to modifications of the embodiment.

DETAILED DESCRIPTION

Figure 2:
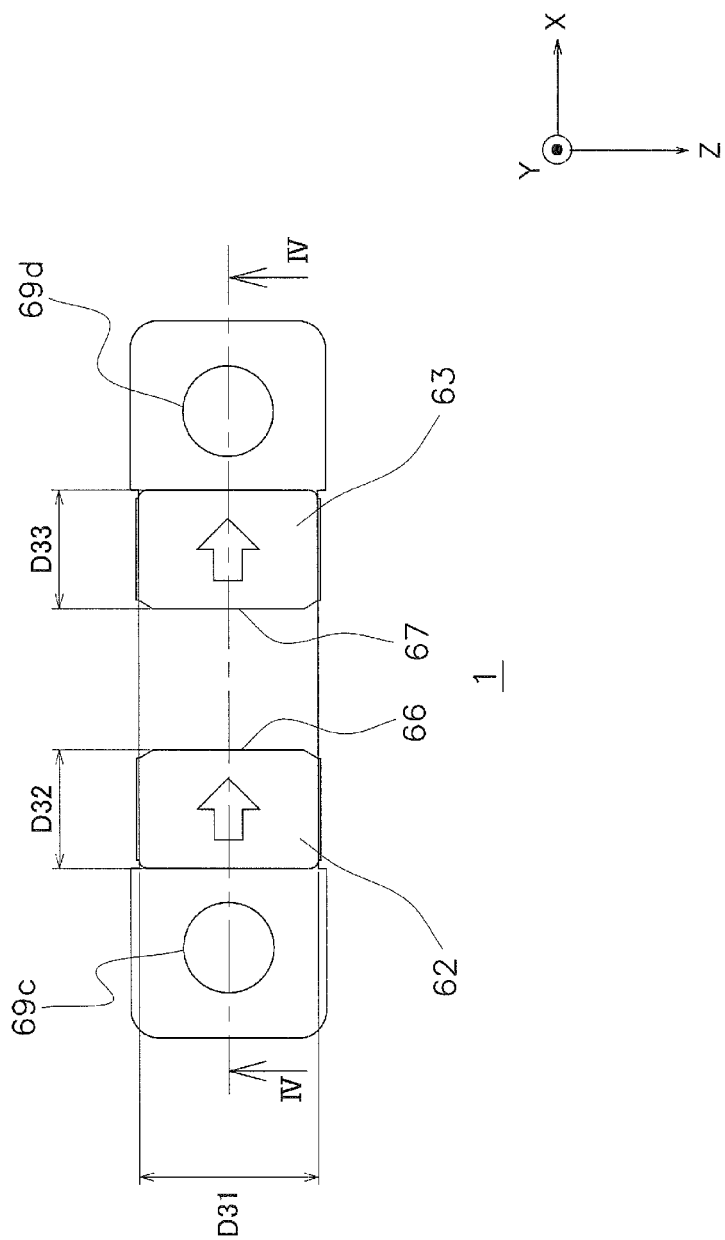
FIG. 2 is a top view of the photosensor according to the embodiment.

An embodiment of the present invention will now be described with reference to the drawings. In the drawings referred to herein, the same numerals indicate the same or the corresponding components.

Figure 3:
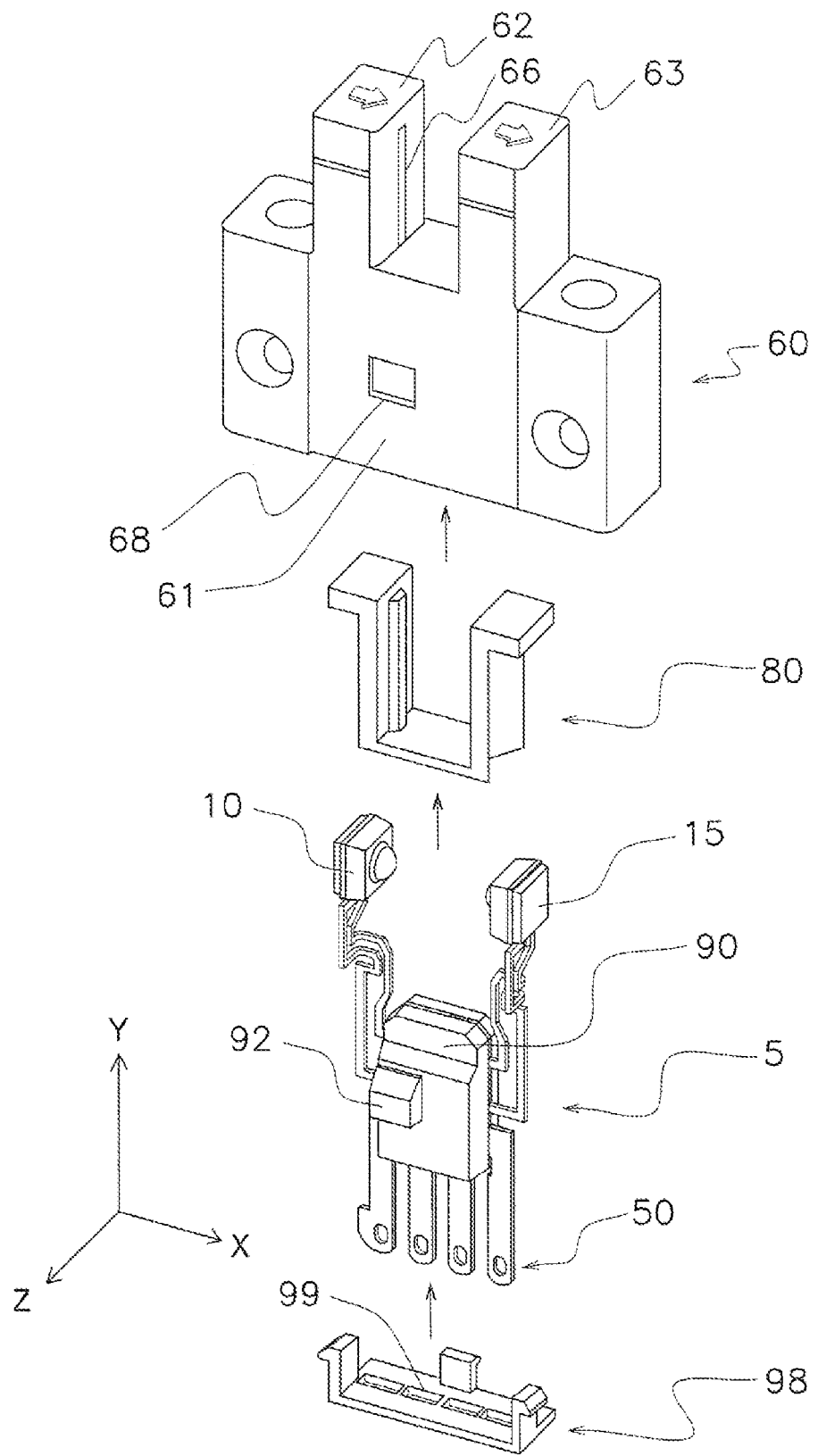
FIG. 3 is an exploded perspective view of the photosensor according to the embodiment.

FIG. 1 is a front view of a photosensor 1. FIG. 2 is a top view of the photosensor 1. FIG. 3 is an exploded perspective view of the photosensor 1. In FIG. 3, the photosensor 1 includes a sensor module 5, a case 60, a subcase 80, and a bottom plate 98.

Figure 4:
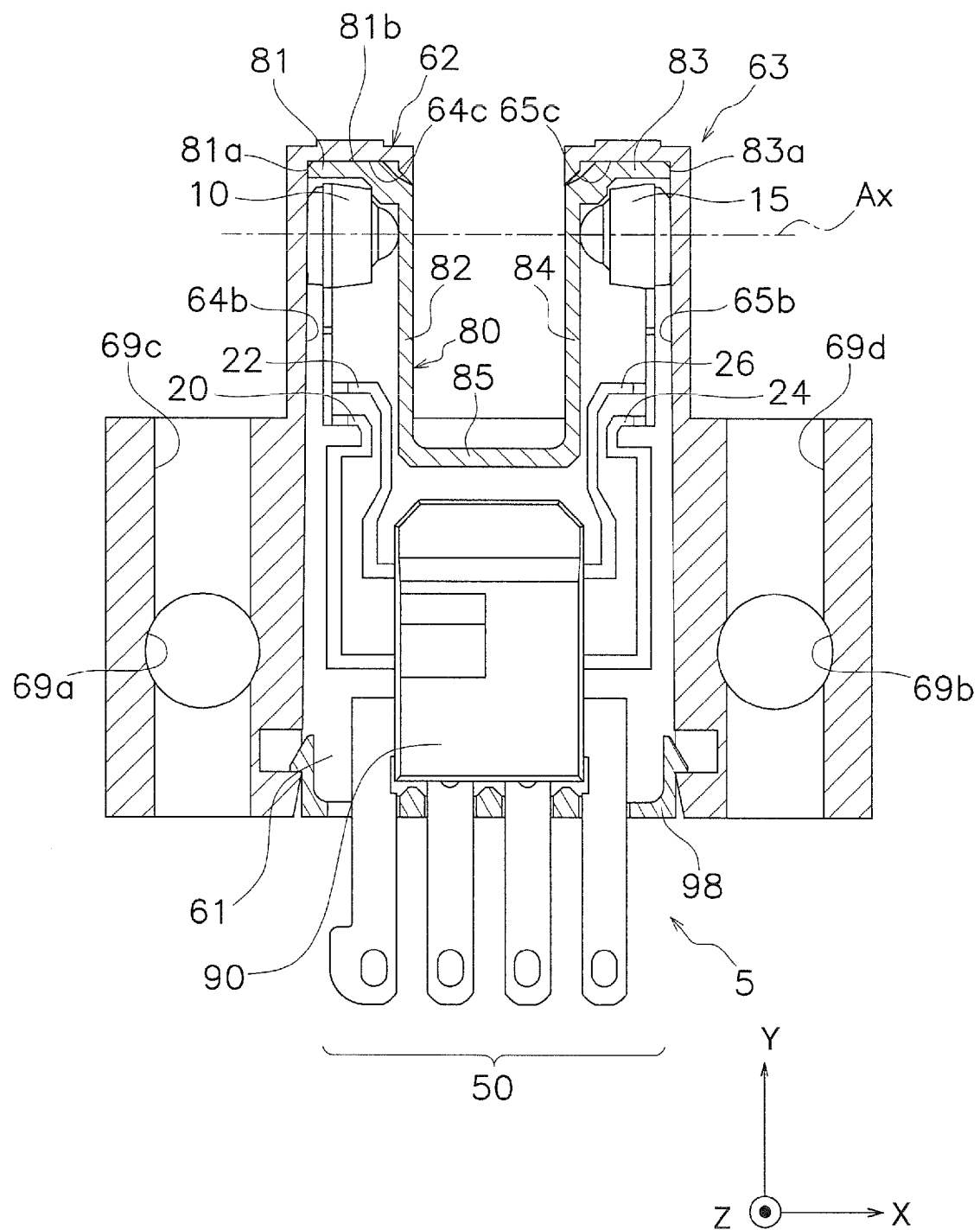
FIG. 4 is a cross-sectional view of the photosensor taken along line IV-IV in FIG. 2.
Figure 5:
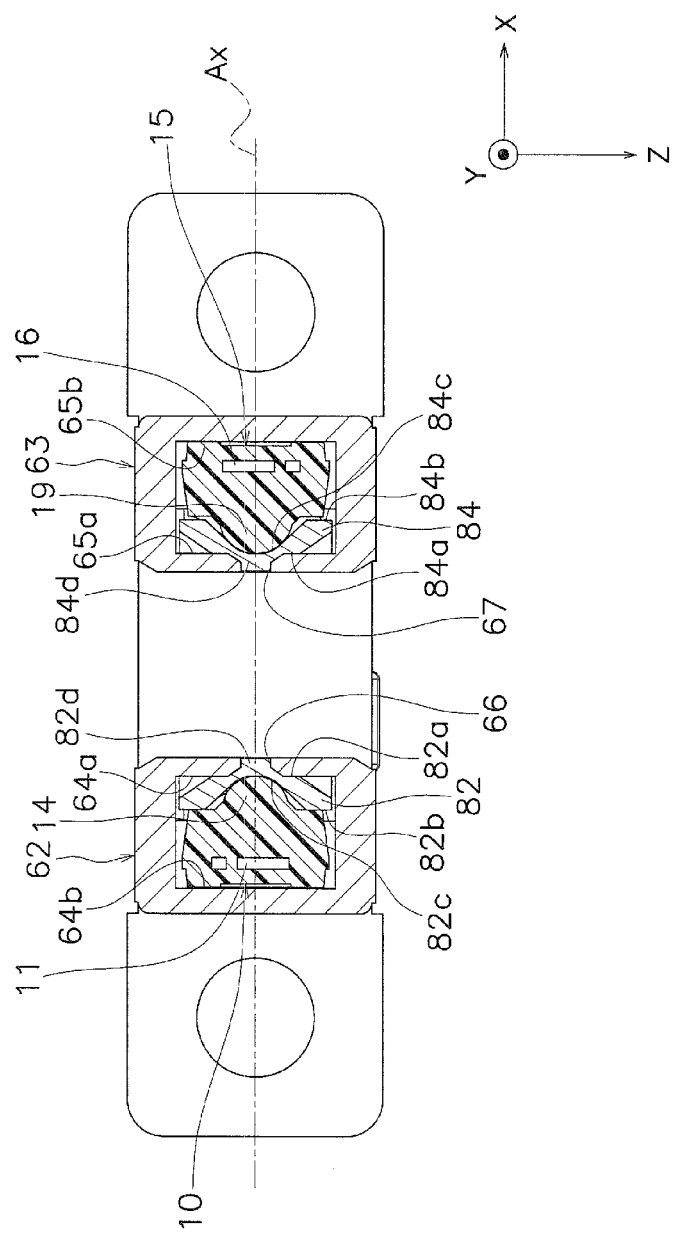
FIG. 5 is a cross-sectional view of the photosensor taken along line V-V in FIG. 1.

As shown in FIG. 1, the case 60 includes a case body 61, an emitter case section 62, and a receiver case section 63. FIG. 4 is a cross-sectional view of the photosensor taken along line IV-IV in FIG. 2. In FIG. 4, the sensor module 5 is not sectioned. Referring to FIG. 4, the case body 61 accommodates a circuit-encapsulating portion 90, which will be described below. The emitter case section 62 accommodates a light emitter 10, a first emitter lead 20, and a second emitter lead 22, which will be described below. The receiver case section 63 accommodates a light receiver 15, a first receiver lead 24, and a second receiver lead 26, which will be described below. The emitter case section 62 and the receiver case section 63 extend upward from the case body 61. FIG. 5 is a cross-sectional view of the photosensor taken along line V-V in FIG. 1. Referring to FIG. 5, the emitter case section 62 includes an emitter slit 66 on its surface facing the receiver case section 63. The receiver case section 63 includes a receiver slit 67 on its surface facing the emitter case section 62.

The present embodiment defines the directions as described below unless otherwise specified. The direction from the emitter slit 66 toward the receiver slit 67 is the right, and the direction opposite to this direction is the left. In the figures, the positive direction of X axis is the right. The right and the left correspond to the direction of an optical axis Ax of the light emitted from the light emitter 10 toward the light receiver 15 described below. The direction from the connecting terminals 50 toward the emitter and receiver case sections 62 and 63 is an upward direction, and the direction opposite to this direction is a downward direction. In the figures, the positive direction of Y axis is the upward direction. The direction from the center of the photosensor 1 toward the surface of the case 60 including an indicator lamp window 68 is the front, and the direction opposite to this direction is the back. In the figures, the positive direction of Z axis is the front.

The emitter case section 62 and the receiver case section 63 face each other. The photosensor 1 includes the pair of emitter and receiver slits 66 and 67 facing each other on an upper portion of the case 60. The emitter case section 62 and the receiver case section 63 are spaced from each other in the direction of the optical axis Ax (X-axis direction). As shown in FIGS. 1 and 2, the case 60 includes mounting holes 69a, 69b, 69c, and 69d, which are formed through the case 60 in directions perpendicular to the direction in which the emitter and receiver slits 66 and 67 face each other (Y-axis and X-axis directions in FIG. 1).

In the photosensor 1, the sensor module 5 includes a plurality of connecting terminals 50, which protrude outward from the bottom plate 98. As shown in FIG. 1, the case 60 includes the square indicator lamp window 68 on its front surface. Through the indicator lamp window 68, an operator can visually check an operation indicator lamp (hereafter referred to as an operation indicator 92). The operation indicator lamp illuminates under a predetermined condition, or specifically when a light receiving signal from the light receiver 15 exceeds a predetermined threshold or when the signal is below the threshold. The condition for turning on the operation indicator lamp will be described below.

As shown in FIG. 3, the subcase 80 and the sensor module 5 are placed into the case 60 in this order. The base plate 98, which includes holes 99 through which the connecting terminals 50 are placed, is then attached to the bottom of the case 60.

Figure 6:
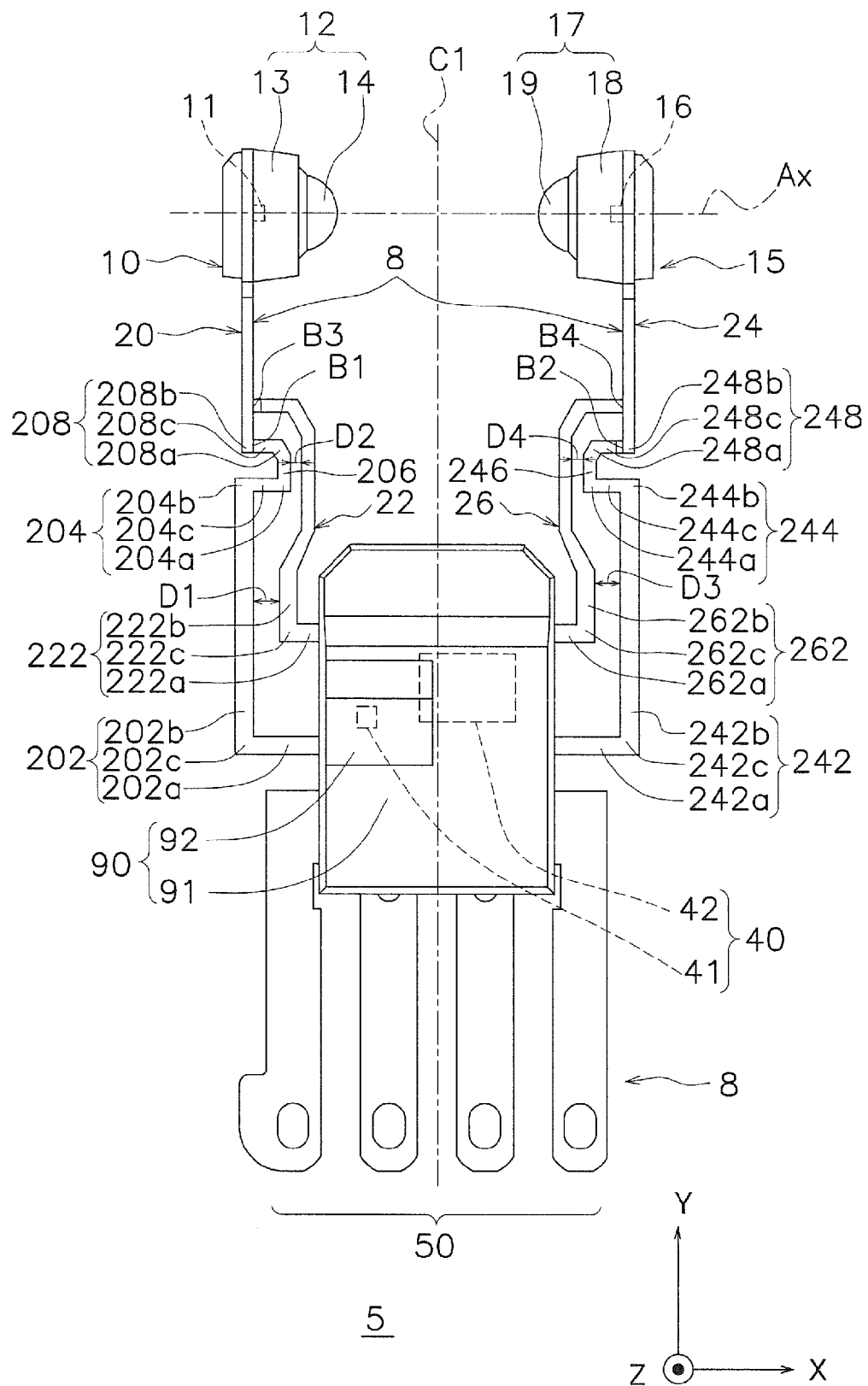
FIG. 6 is a plan view of a sensor module according to the embodiment.
Figure 7:
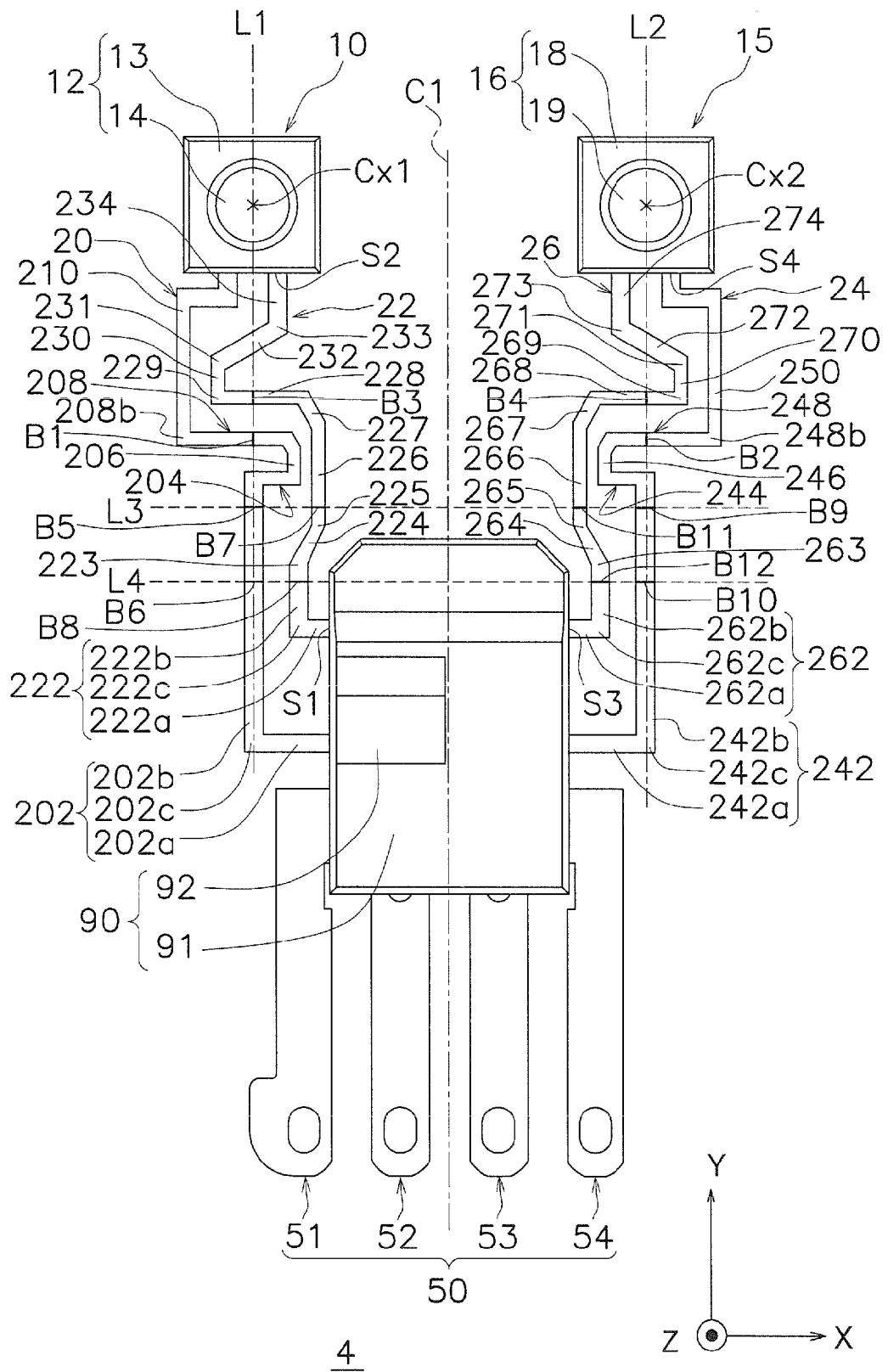
FIG. 7 is a plan view of a primary molded piece of the sensor module according to the embodiment.
Figure 8:
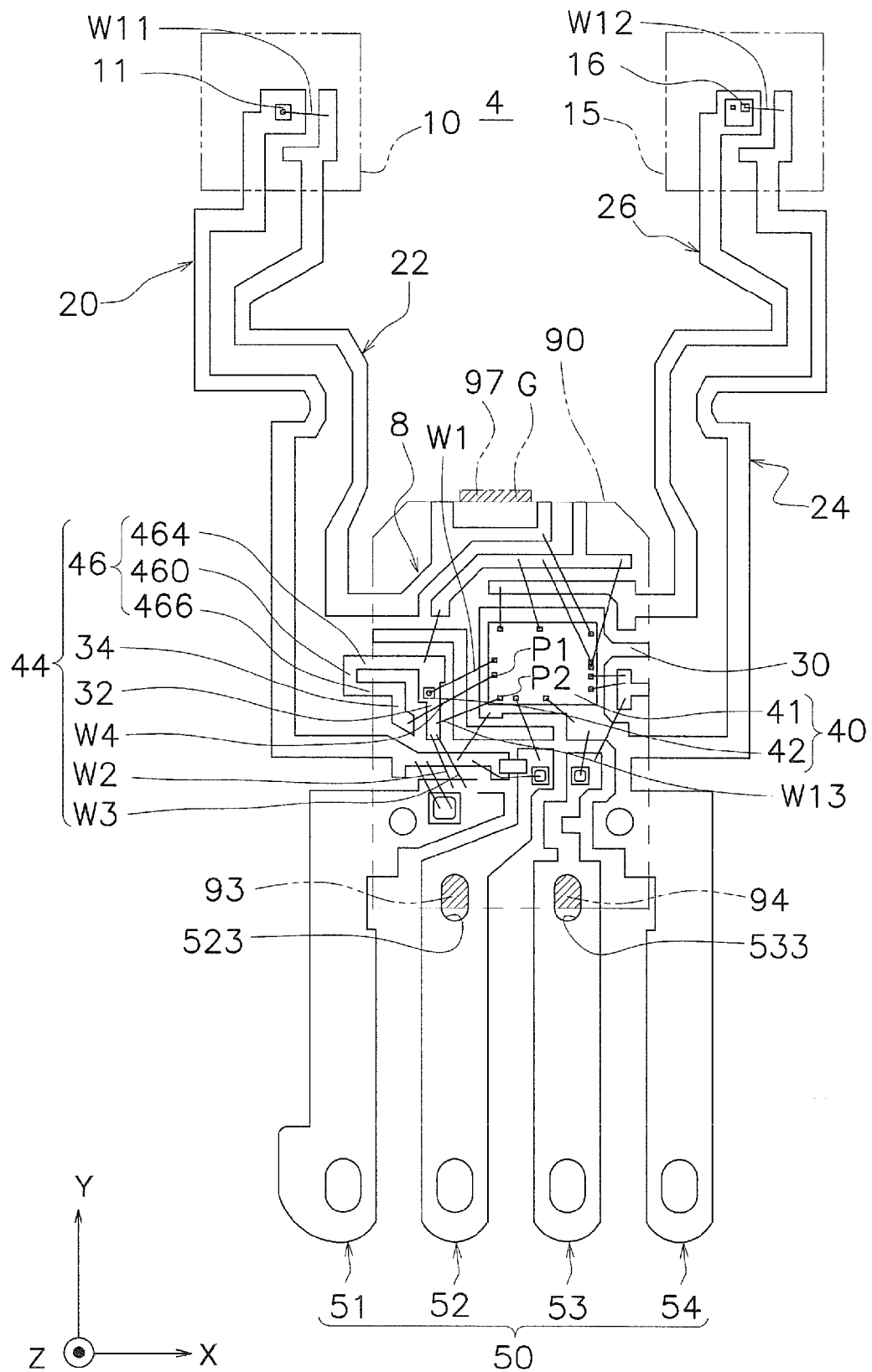
FIG. 8 is a plan view of the detailed internal circuitry covered by resin in the sensor module shown in FIG. 6.

FIG. 6 is a plan view of the sensor module 5. FIG. 7 is a plan view of a primary molded piece of the sensor module 5. In other words, FIG. 7 is an unfolded view of the sensor module 5 in FIG. 6. The sensor module 5 unfolded in a plane shown in FIG. 7 is hereafter referred to as a sensor module 4. FIG. 8 is a plan view of the detailed internal circuitry covered by resin in the sensor module 4 shown in FIG. 6.

Referring to FIG. 6, the sensor module 5 includes the light emitter 10, the light receiver 15, the first emitter lead 20, the second emitter lead 22, the first receiver lead 24, the second receiver lead 26, the integrated circuit 41, the circuit-encapsulating portion 90, and the connecting terminals 50. The first emitter lead 20, the second emitter lead 22, the first receiver lead 24, the second receiver lead 26, and the connecting terminals 50 are hereafter collectively referred to as a leadframe 8. The sensor module may be referred to as a photosensor component. The leadframe 8 includes conductive flat plates. In other words, the first emitter lead 20, the second emitter lead 22, the first receiver lead 24, the second receiver lead 26, and the connecting terminals 50 are the flat plates.

The light emitter 10 includes an emitter element 11 and an emitter-encapsulating portion 12. The emitter-encapsulating portion 12 includes an emitter base 13 and an emitter lens 14. In one example, the emitter element 11 is a light-emitting diode, although it may be another element. The emitter-encapsulating portion 12 encapsulates the emitter element 11 with resin. The emitter base 13 covers the emitter element 11. The emitter lens 14 has a curved surface, and protrudes from the emitter base 13. The emitter lens 14 is circular as viewed in the direction of light being emitted. The emitter lens 14 collimates the light emitted from the emitter element 11, and thus prevents the light from the emitter element 11 from diverging.

The light receiver 15 receives light from the light emitter 10, and outputs a light receiving signal. The light receiver 15 includes a receiver element 16 and a receiver-encapsulating portion 17. The receiver-encapsulating portion 17 includes a receiver base 18 and a receiver lens 19. In one example, the receiver element 16 is a phototransistor, although it may be another element. The receiver element 16 and the emitter element 11 are arranged to face each other. More specifically, the photosensor 1 according to this embodiment is a transmissive photosensor that detects whether the receiver element 16 can directly receive light emitted from the emitter element 11. The receiver-encapsulating portion 17 encapsulates the receiver element 16 with resin. The receiver base 18 covers the receiver element 16. The emitter lens 19 has a curved surface, and protrudes from the emitter base 18. The emitter lens 19 is circular as viewed in the direction of light being received. The emitter lens 14 focuses light from the emitter element 11 onto the receiver element 16.

Referring to FIG. 8, the emitter element 11 is mounted on the first emitter lead 20. In other words, the emitter element 11 is mounted on the leadframe 8. The receiver element 16 is mounted on the second receiver lead 26. In other words, the receiver element 16 is mounted on the leadframe 8.

The integrated circuit 41 is electrically connected to the emitter element 11 and the receiver element 16. The integrated circuit 41 is mounted on a main lead 30, which is a part of the leadframe 8. The integrated circuit 41 is fixed to the leadframe 8 by, for example, die bonding, and is wired by wire bonding. In this manner, the integrated circuit 41 is mounted onto the leadframe 8. The leadframe 8 thus includes the main lead 30, and is connected to the integrated circuit 41. The main lead 30, which is to be encapsulated in the circuit-encapsulating portion described below, is a part of the leadframe 8 excluding the leads that function as the connecting terminals 50. The leads that function as the connecting terminals 50 will be described below.

The first emitter lead 20 and the second emitter lead 22 connect the light emitter 10 and the circuit-encapsulating portion 90. More specifically, the first emitter lead 20 connects the emitter element 11 and the main lead 30. The second emitter lead 22 and a wire W11 connect the emitter element 11 and the main lead 30. The main lead 30 is connected to the integrated circuit 41 to connect the light emitter 10 to the integrated circuit 41 with the first and second emitter leads 20 and 22. The downward direction (the direction in which the connecting terminals 50 extend, or the negative direction of Y axis) is referred to as a first direction. A plane parallel to the first direction is referred to as a first plane. The first plane is, for example, a plane defined by the surfaces of the connecting terminals 50 (XY plane). The first emitter lead 20 and the second emitter lead 22 extend from the circuit-encapsulating portion 90 in a direction parallel to the first plane and intersecting with the first direction (to the left, or in the negative direction of X axis). The first emitter lead 20 and the second emitter lead 22 extend in a direction opposite to the first direction (the positive direction of Y axis).

The first receiver lead 24 and the second receiver lead 26 connect the light receiver 15 and the circuit-encapsulating portion 90. More specifically, the first receiver lead 24 and a wire W12 connect the receiver element 16 and the main lead 30. The main lead 30 is connected to the integrated circuit 41 to connect the light receiver 15 to the integrated circuit 41 with the first and second receiver leads 24 and 26. As shown in FIG. 6, a plane perpendicular to the optical axis Ax of light emitted from the light emitter 10 toward the light receiver 15 and including the midpoint between the light emitter 10 and the light receiver 15 is referred to as a plane C1. In this case, the first receiver lead 24 and the second receiver lead 26 protrude from the circuit-encapsulating portion 90 in a direction parallel to the first plane and intersecting with the first direction. The first receiver lead 24 and the second receiver lead 26 extend in the direction opposite to the direction in which the first emitter lead 20 and the second emitter lead 22 extend (to the right, or in the positive direction of X axis). When, for example, the circuit-encapsulating portion 90 is a rectangular prism, the first receiver lead 24 and the second receiver lead 26 protrude from the surface of the circuit-encapsulating portion 90 facing the surface from which the first emitter lead 20 and the second emitter lead 22 protrude. These leads may protrude at any angles. The first and second receiver leads 24 and 26 protrude from the circuit-encapsulating portion 90 by a predetermined length and then bend, and extend in the direction opposite to the first direction (or the positive direction of Y axis).

As shown in FIG. 6, the first emitter lead 20 and the second emitter lead 22 and the first receiver lead 24 and the second receiver lead 26 in the sensor module 5 are bent and deformed to allow the light emitter 10 and the light receiver 15 to face each other. The light receiver 15 is arranged to face the light emitter 10. In the example of FIG. 6, each of the first and second emitter leads 20 and 22 and the first and second receiver leads 24 and 26 is bent at a single point. Alternatively, the leads may be bent at a plurality of points, or may be twisted. The specific shapes and the bending characteristics of the first and second emitter leads 20 and 22 and the first and second receiver leads 24 and 26 will be described below.

The integrated circuit 41 includes, for example, an integrated circuit (IC) chip. The integrated circuit 41 applies a voltage to the gate of a transistor (not shown) connected to the emitter element 11 to allow a current to flow through the emitter element 11, which then emits light. Through this process, the integrated circuit 41 controls light emission from the emitter element 11. The integrated circuit 41 includes a current-voltage converter circuit, an amplifier circuit, and an A/D converter circuit (not shown). The integrated circuit 41 converts a photocurrent output from the receiver element 16 to a voltage, amplifies the voltage, and then determines the value of a light receiving signal, which is a digital value. The integrated circuit 41 also determines whether the receiver element 16 has received light by comparing the signal value with a predetermined threshold. This threshold is set based on the light receiving signals measured in a first case in which an object blocking light is detected between the light emitter 10 and the light receiver 15 and a second case in which no such object is detected between. The threshold allows the integrated circuit 41 to distinguish between the first case and the second case. The threshold is stored in, for example, an internal memory of the integrated circuit 41.

The sensor modules 4 and 5 each include an emitter element 42, which illuminates the operation indicator 92. The integrated circuit 41 is connected to the luminous element 42 with the wire W1. The integrated circuit 41 controls the luminous element 42 based on a result of determination for light reception. The luminous element 42, which is for example a light-emitting diode, is mounted on the main lead 30. In other words, the luminous element 42 is mounted on the leadframe 8. The integrated circuit 41 and the luminous element 42 are hereafter collectively referred to as a circuit portion 40. The integrated circuit 41 processes the light receiving signal transmitted from the light receiver 15. Either when the value of the light receiving signal exceeds the threshold, or when the signal value is below the threshold, the integrated circuit 41 applies a control signal with a predetermined voltage to a transistor (not shown) connected to the luminous element 42 to turn on the luminous element 42. The luminous element 42 indicates the operation of the photosensor 1, or specifically the result of the processing performed by the integrated circuit 41.

In response to a light receiving signal from the light receiver 15, the integrated circuit 41 performs either the first processing or the second processing described below.

First Processing: When the value of the light receiving signal exceeds a predetermined threshold, the integrated circuit 41 outputs a control signal for turning on the luminous element 42 (an ON signal, or for example a signal for outputting a power supply voltage Vcc). When the value of the light receiving signal is below the predetermined threshold, the integrated circuit 41 outputs a control signal for turning off the luminous element 42 (an OFF signal, or for example a signal for outputting 0 V).

Second Processing: When the value of the light receiving signal exceeds a predetermined threshold, the integrated circuit 41 outputs a control signal for turning off the luminous element 42 (an OFF signal). When the value of the light receiving signal is below the predetermined threshold, the integrated circuit 41 outputs a control signal for turning on the luminous element 42 (an ON signal).

Switching Terminal

The integrated circuit 41 switches between the first processing and the second processing in accordance with the voltage at a port P1. The voltage at the port P1 differs depending on whether a protrusion 46 included in a power supply voltage wiring group 44 has been cut. Referring to FIG. 8, the power supply voltage wiring group 44 includes wires and leads for transmitting the power supply voltage Vcc to the port P1. The power supply voltage wiring group 44 includes wires W2, W3, and W4, the protrusion 46, and a first lead 32 and a second lead 34. The first lead 32 and the second lead 34 are parts of the main lead 30. In other words, the main lead 30 includes the first lead 32 and the second lead 34. When the protrusion 46 is connected to the first lead 32 and the second lead 34, the protrusion 46 and the first lead 32 and the second lead 34 form a single lead. In other words, the leadframe 8 includes the protrusion 46, the first lead 32, and the second lead 34.

The power supply voltage Vcc is applied to a power supply connecting terminal 51, which is one of the connecting terminals 50. The wires W2 and W3 connect the power supply connecting terminal 51 to the first lead 32. The first lead 32 is connected to a port P2 of the integrated circuit 41 with a wire W13. The protrusion 46 is connected to the first lead 32 and extends out of the circuit-encapsulating portion 90. The protrusion 46 is connected to the second lead 34. The wire W4 connects the second lead 34 to the port P1 of the integrated circuit 41. When the protrusion 46 remains connected, the port P1 receives the power supply voltage Vcc applied from the power supply connecting terminal 51 through the wires W2 and W3, the first lead 32, the protrusion 46, the second lead 34, and the wire W4. When the protrusion 46 has been cut, the second lead 34, the wire W4, and the port P1 enter an electrically floating state (with no electrical connection). In this case, a voltage other than the power supply voltage Vcc (for example, 0 V) is applied to the port P1. When the power supply voltage Vcc is applied to the port P1, the integrated circuit 41 performs one of the first processing or the second processing described above. When a voltage other than the power supply voltage Vcc is applied to the port P1, the integrated circuit 41 performs the other one of the first processing or the second processing. The figures other than FIG. 8 each show the module from which the protrusion 46 has been removed.

Figure 9:
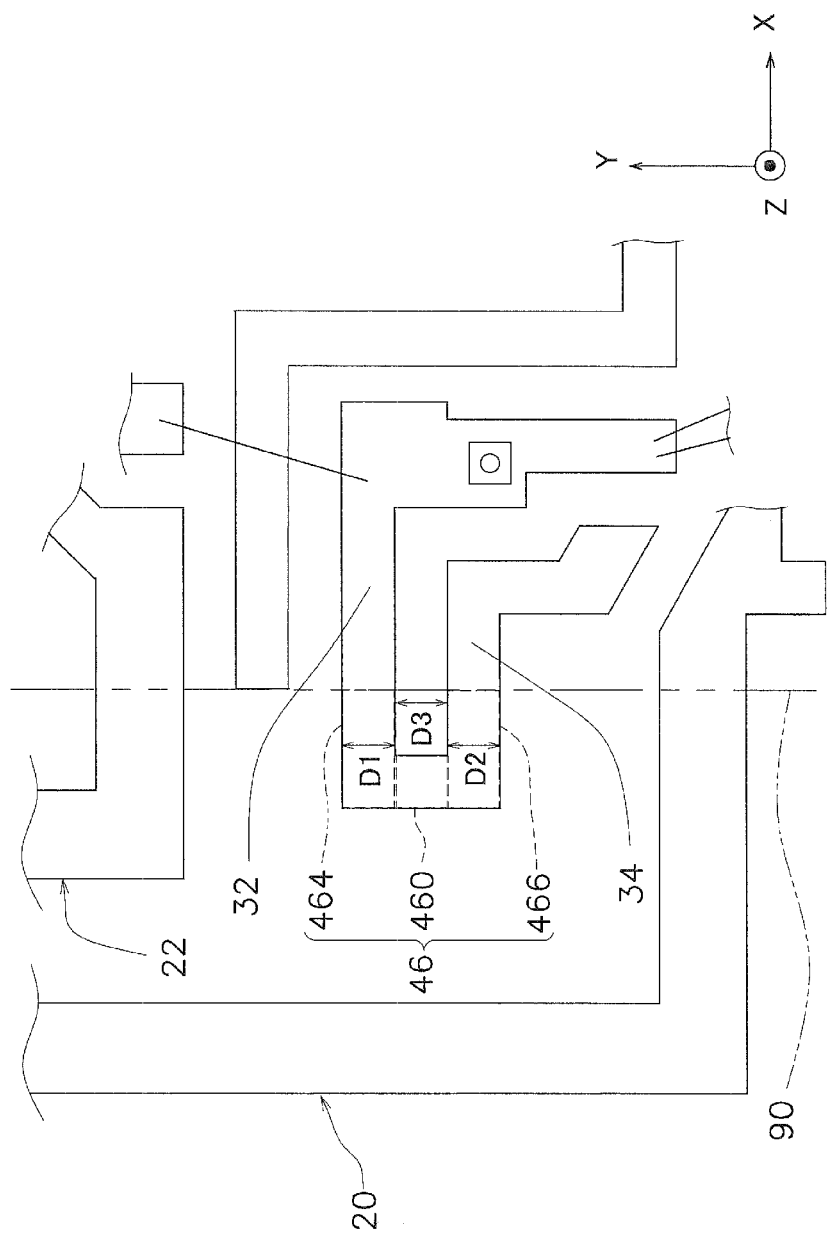
FIG. 9 is an enlarged view of an area including a protrusion.

FIG. 9 is an enlarged view of an area including the protrusion 46. Referring to FIG. 9, the protrusion 46 includes a first protrusion 464, a second protrusion 466, and an external connector 460. The first protrusion 464 connects to the first lead 32. The second protrusion 466 connects to the second lead 34. The first protrusion 464 and the second protrusion 466 protrude at different positions of the circuit-encapsulating portion 90. The external connector 460 connects the first protrusion 464 to the second protrusion 466. The external connector 460 extends from the first protrusion 464 in a direction different from the direction in which the first protrusion 464 protrudes. Likewise, the external connector 460 extends from the second protrusion 466 in a direction different from the direction in which the second protrusion 466 protrudes.

The first protrusion 464 and the first lead 32 may be collectively referred to as a first leadframe. The second protrusion 466 and the second lead 34 may be collectively referred to as a second leadframe. The sensor module 5 is fixed in either a first state where the first protrusion 464 and the second protrusion 466 are electrically connected, or a second state where the first protrusion 464 and the second protrusion 466 are electrically isolated. The sensor module 5 fixed in the first state performs one of the first processing or the second processing described above. The sensor module 5 fixed in the second state performs the other one of the first processing or the second processing.

The first protrusion 464 has a width D1 in the direction perpendicular to the direction in which the first protrusion 464 protrudes. The second protrusion 466 has a width D2 in the direction perpendicular to the direction in which the second protrusion 466 protrudes. The first protrusion 464 and the second protrusion 466 are spaced from each other by a distance D3, which is not less than the width D1 and not less than the width D2, at an end surface of the circuit-encapsulating portion 90 from which the first and second protrusions 464 and 466 protrude. This structure prevents the first lead 32 and the second lead 34 from coming in contact with each other with burrs that can form when the protrusion 46 is cut and removed.

As shown in FIG. 8, the protrusion 46 is arranged between the first emitter lead 20 and the second emitter lead 22 on the first plane (XY plane) described above. The protrusion 46 may be arranged between the first receiver lead 24 and the second receiver lead 26 on the first plane (XY plane). This arrangement reduces the likelihood that the protrusion 46 can come in contact with the case 60 when the sensor module 5 is encased, and thus prevents the protrusion 46 from being disconnected accidentally when the sensor module 5 is encased.

As described above with reference to FIG. 9, the first processing and the second processing can be switched depending on whether the protrusion 46 is cut. Alternatively, the external connector 460 may be a conductive member separate from the first protrusion 464 and the second protrusion 466. In this structure, the external connector 460 may be attached or detached to switch the processing of the sensor module 5 between the first processing and the second processing. The external connector 460, which is a separate member from the first protrusion 464 and the second protrusion 466, may be referred to as a connector chip. The connector chip is, for example, a rectangular member having a width not less than D3.

Figure 10:
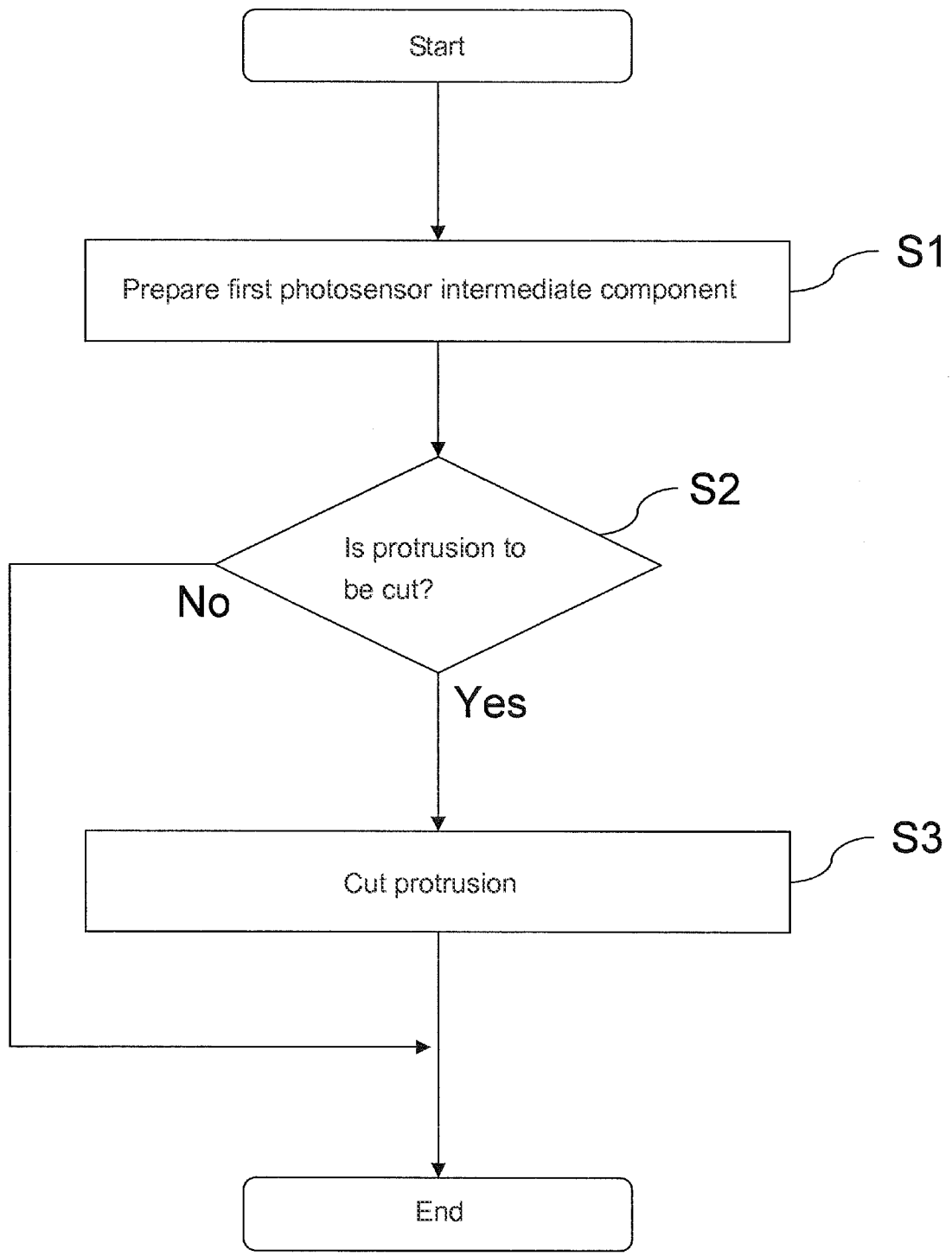
FIG. 10 is a flowchart showing a method for manufacturing a sensor module according to the embodiment.

A method for manufacturing a sensor module using the protrusion 46 will now be described. FIG. 10 is a flowchart showing a method of manufacturing the sensor module 4. In step S1, an intermediate component for a first photosensor is prepared. The first photosensor intermediate component is a sensor module (a sensor component) including the protrusion 46 shown in FIGS. 8 and 9 in the stage in which whether the protrusion 46 is to be cut has yet to be determined. In one example, the first photosensor intermediate component is prepared in the manner described below. The emitter element 11, the receiver element 16, the integrated circuit 41, and the luminous element 42 are first mounted onto the leadframe 8 by die bonding. The components are then connected to the leadframe by wire bonding. Subsequently, a resin molding process is performed to form the light emitter 10, the light receiver 15, and the circuit-encapsulating portion 90. Unnecessary portions of the leadframe 8 are then removed. The primary molded piece is released from the leadframe 8, and burrs on the molded piece are removed.

After the processing in step S1 completes, the manufacturer determines whether any part of the protrusion 46, which includes the first protrusion 464, the second protrusion 466, and the external connector 460 of the first photosensor intermediate component, is to be cut (step S2). When determining that the protrusion 46 is to be cut in step S2 (Yes in step S2), the manufacturer cuts the protrusion 46 (step S3). When the protrusion 46 is determined not to be cut in step S2 (No in step S2), or when the processing in step S3 is performed, the manufacturing processes end.

Figure 11:
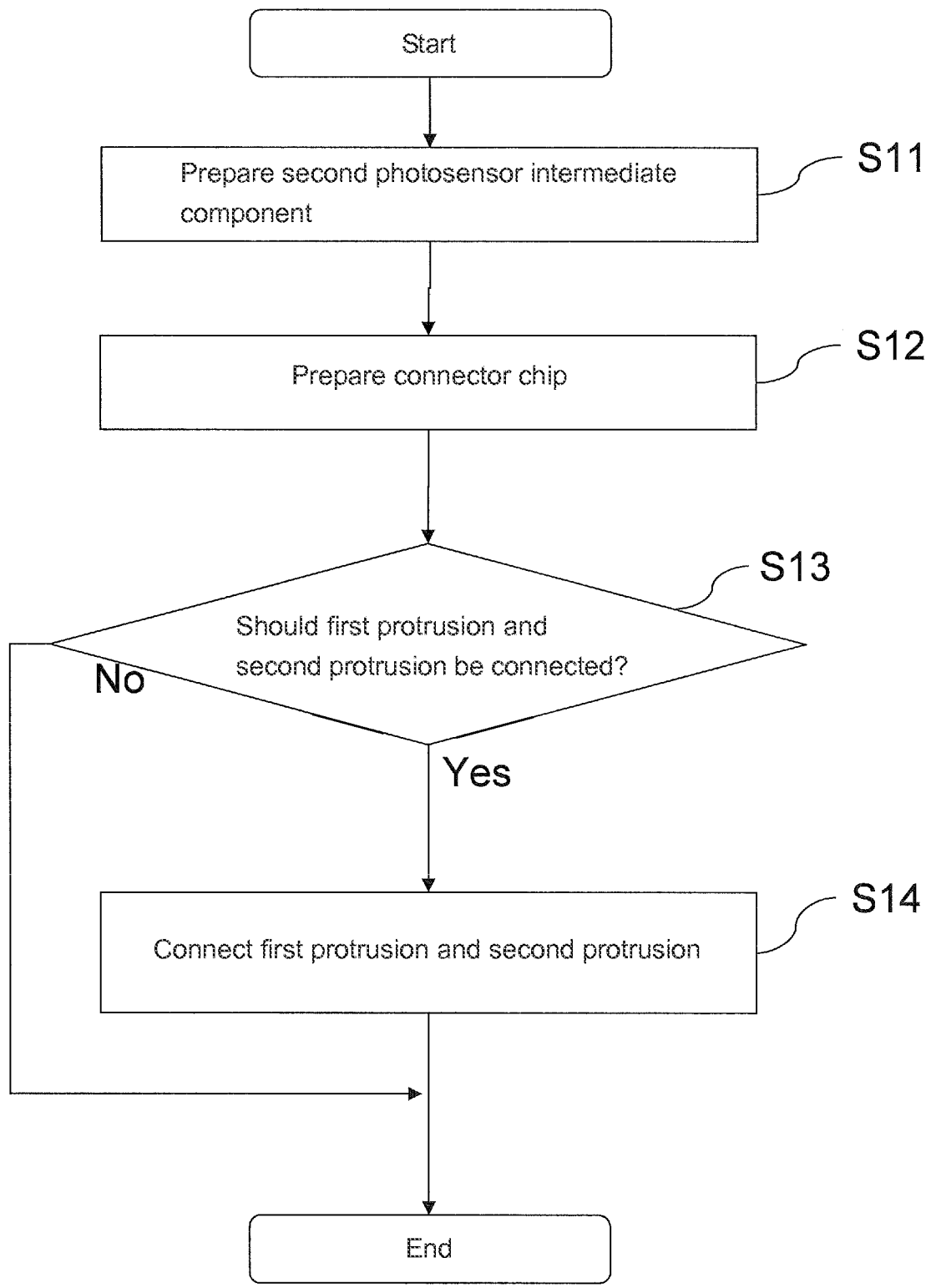
FIG. 11 is a flowchart showing another method for manufacturing a sensor module according to the embodiment.

A method for manufacturing a sensor module using the connector chip that can connect the first protrusion 464 and the second protrusion 466 will now be described. FIG. 11 is a flowchart showing a different method for manufacturing the sensor module 4. In step S11, an intermediate component for a second photosensor is prepared. The second photosensor intermediate component differs from the first photosensor intermediate component in that its protrusion 46 consists of the first protrusion 464 and the second protrusion 466 and does not include the external connector 460. The method for preparing the second photosensor intermediate component is substantially the same as the method described above for the first photosensor intermediate component.

When the processing in step S11 completes, the manufacturer prepares a connector chip that can connect the first protrusion 464 and the second protrusion 466 (step S12). The connector chip may be made of any conductive material. The manufacturer then determines whether the first protrusion 464 and the second protrusion 466 in the second photosensor intermediate component are to be connected (step S13). When determining that the protrusions are to be connected in step S13 (Yes in step S13), the manufacturer connects the first protrusion 464 and the second protrusion 466 with the connector chip by, for example, soldering (step S14). When the protrusions are determined not to be connected in step S13 (No in step S13), or when the processing in step S14 is performed, the manufacturing processes end.

Resin for Circuit-Encapsulating Portion, Light Emitter, and Light Receiver

Figure 12:
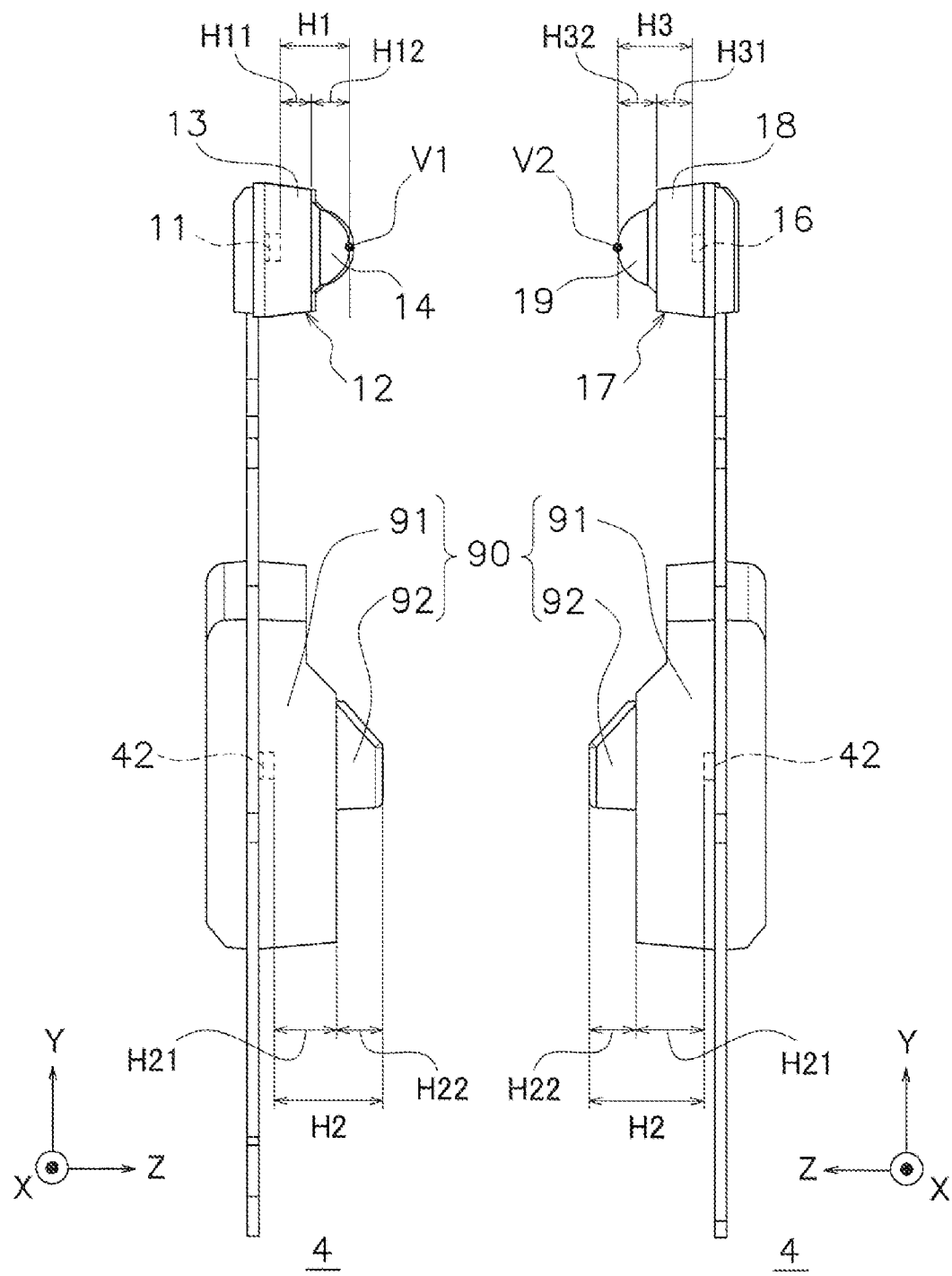
FIGS. 12A and 12B are side views of the sensor module shown in FIG. 7.

As shown in FIGS. 6 to 8, the circuit-encapsulating portion 90 encapsulates the circuit portion 40. FIGS. 12A and 12B are side views of the sensor module shown in FIG. 7. FIG. 12A is a left side view of the sensor module 4 shown in FIG. 7, and FIG. 12B is a right side view of the sensor module 4 shown in FIG. 7. In FIGS. 12A and 12B, the dotted lines indicate the emitter element 11, the receiver element 16, and the luminous element 42.

Referring now to FIGS. 7, 8, and 12A and 12B, the circuit-encapsulating portion 90 includes a circuit encapsulating body 91 and the operation indicator 92. The circuit encapsulating body 91 encapsulates the circuit portion 40. More specifically, the circuit encapsulating body 91 encapsulates the integrated circuit 41 with resin. The circuit encapsulating body 91 further encapsulates the luminous element 42 with resin. The operation indicator 92 is arranged on the circuit encapsulating body 91. The operation indicator 92 faces the luminous element 42. In other words, the operation indicator 92 allows the light emitted from the luminous element 42 to pass through it.

The emitter-encapsulating portion 12, the receiver-encapsulating portion 17, and the circuit-encapsulating portion 48 are formed from the same resin material containing the same concentration of light diffusing agent. The emitter-encapsulating portion 12, the receiver-encapsulating portion 17, and the circuit-encapsulating portion 48 are connected to one another with the leadframe 8. When the positive direction of Z axis is the upward direction in FIG. 12A, the distance H11 from the upper end of the emitter element 11 to the upper end of the emitter base 13 is smaller than the distance H21 from the upper end of the luminous element 42 to the upper end of the circuit encapsulating body 91. The positive direction of Z axis also corresponds to the direction in which the emitter element 11 emits light and also corresponds to the direction in which the luminous element 42 emits light. Thus, the thickness H11 of the emitter base 13 in the direction in which the emitter element 11 emits light is smaller than the thickness H21 of the circuit encapsulating body 91 in the direction in which the luminous element 42 emits light. Additionally, when the positive direction of Z axis is the upward direction, the distance H12 from the upper end of the emitter base 13 to the upper end V1 (apex) of the emitter lens 14 is smaller than the thickness H22 of the operation indicator 92 in the Z-direction. The thickness H12 of the emitter lens 19 in the direction in which the emitter element 11 emits light is smaller than the thickness H22 of the operation indicator 92 in the direction in which the luminous element 42 emits light. Thus, when the positive direction of Z axis is the upward direction, the distance H1 from the upper end of the emitter element 11 to the upper end V1 (apex) of the emitter lens 19 is smaller than the distance H2 from the upper end of the luminous element 42 to the upper end of the operation indicator 92. In other words, the thickness H1 of the resin portion of the emitter-encapsulating portion 12 covering the light emitting surface of the emitter element 11 in a direction perpendicular to the light emitting surface is smaller than the thickness H2 of the resin portion of the circuit-encapsulating portion 90 covering the luminous surface of the luminous element 42 in a direction perpendicular to the luminous surface. The surface of the emitter-encapsulating portion 12 facing the light emitting surface includes a curved surface. The thickness H1 of the resin portion of the emitter-encapsulating portion 12 between the light emitting surface of the emitter element 11 and the apex of the curved surface is smaller than the thickness H2 of the resin portion of the circuit-encapsulating portion 90 covering the luminous surface of the luminous element 42 in a direction perpendicular to the luminous surface. When the encapsulating resin contains a space filled with no resin, the thickness of the resin portion does not include the thickness of the space filled with no resin. When the thickness of the emitter-encapsulating portion 12 or the thickness of the circuit-encapsulating portion 90 is not uniform, the thinnest resin portion of the emitter-encapsulating portion 12 in the direction perpendicular to the light emitting surface may be compared with the thickest resin portion of the circuit-encapsulating portion 90 in the direction perpendicular to the luminous surface. Alternatively, the average thickness of the resin of the emitter-encapsulating portion 12 in the direction perpendicular to the light emitting surface may be compared with the average thickness of the resin of the circuit-encapsulating portion 90 in the direction perpendicular to the luminous surface. Alternatively, the thickest resin portion of the emitter-encapsulating portion 12 in the direction perpendicular to the light emitting surface may be compared with the thinnest resin portion of the circuit-encapsulating portion 90 in the direction perpendicular to the luminous surface. When the emitter element 11 and the luminous element 42 are surface-mounted light emitting diodes (LEDs) or chip-on-board LEDs, the light emitting surface and the luminous surface each refer to the surface of the phosphor-containing resin encapsulating the LED chip facing the exterior of the LED. The distance H2 is 1.5 times larger than the distance H1.

Referring to FIG. 12B, when the positive direction of Z axis is the upward direction, the distance H31 from the upper end of the receiver element 16 to the upper end of the receiver base 18 is smaller than the distance H21 from the upper end of the luminous element 42 to the upper end of the circuit encapsulating body 91. The negative direction of Z axis also corresponds to the direction in which the receiver element 16 receives light, and the positive direction of Z axis also corresponds to the direction in which the luminous element 42 emits light. Thus, the thickness H31 of the receiver base 18 in the direction in which the receiver element 16 receives light is smaller than the thickness H21 of the circuit encapsulating body 91 in the direction in which the luminous element 42 emits light. Additionally, when the positive direction of Z axis is the upward direction, the distance H32 from the upper end of the receiver base 18 to the upper end V2 (apex) of the receiver lens 19 is smaller than the thickness H22 of the operation indicator 92 in the Z-direction. The thickness H32 of the receiver lens 19 in the direction in which the receiver element 16 receives light is smaller than the thickness H22 of the operation indicator 92 in the direction in which the luminous element 42 emits light. Thus, when the positive direction of Z axis is the upward direction, the distance H3 from the upper end of the receiver element 16 to the upper end V2 (apex) of the receiver lens 19 is smaller than the distance H2 from the upper end of the luminous element 42 to the upper end of the operation indicator 92. More specifically, the thickness of the resin portion of the receiver-encapsulating portion 17 covering the light receiving surface of the light receiver 16 in a direction perpendicular to the light receiving surface is smaller than the thickness of the resin portion of the circuit-encapsulating portion 90 covering the luminous surface of the luminance element 42 in a direction perpendicular to the luminous surface. The surface of the receiver-encapsulating portion 17 facing the light receiving surface includes a curved surface. The thickness of the resin portion of the receiver-encapsulating portion 17 between the light receiving surface of the receiver element 16 and the apex of the curved surface is smaller than the thickness of the resin portion of the circuit-encapsulating portion 90 covering the luminous surface of the luminous element 42 in a direction perpendicular to the luminous surface. When the encapsulating resin contains a space filled with no resin, the thickness of the resin portion does not include the thickness of the space filled with no resin. When the thickness of the receiver-encapsulating portion 17 or the thickness of the circuit-encapsulating portion 90 is not uniform, the thinnest resin portion of the receiver-encapsulating portion 17 in the direction perpendicular to the light receiving surface may be compared with the thickest resin portion of the circuit-encapsulating portion 90 in the direction perpendicular to the luminous surface. Alternatively, the average thickness of the resin of the receiver-encapsulating portion 17 in the direction perpendicular to the light receiving surface may be compared with the average thickness of the resin of the circuit-encapsulating portion 90 in the direction perpendicular to the luminous surface. When the thickness of the receiver-encapsulating portion 17 or the thickness of the circuit-encapsulating portion 90 is not uniform, the thickest resin portion of the receiver-encapsulating portion 17 in the direction perpendicular to the light receiving surface may be compared with the thinnest resin portion of the circuit-encapsulating portion 90 in the direction perpendicular to the luminous surface. When the receiver element 16 is a photodiode, the light receiving surface refers to the photosensitive surface of the photodiode. The distance H2 is 1.5 times larger than the distance H3.

To increase the sensitivity of the photosensor 1, the light emitted from the emitter element 11 and received by the receiver element 16 preferably has minimum diffusion, whereas the light emitted from the luminous element 42 preferably has maximum diffusion to increase the visibility for an operator. The thickness H1 of the emitter-encapsulating portion 12 is smaller than the thickness H2 of the circuit-encapsulating portion 90. The thickness H3 of the receiver-encapsulating portion 17 is smaller than the thickness H2 of the circuit-encapsulating portion 90. This structure allows the emitter-encapsulating portion 12 and the receiver-encapsulating portion 17 to have a lower degree of light diffusion and the circuit-encapsulating portion 90 to have a higher degree of light diffusion, although the emitter-encapsulating portion 12, the receiver-encapsulating portion 17, and the circuit-encapsulating portion 48 are formed from the same resin material containing the same concentration of light diffusing agent.

To diffuse light in the circuit-encapsulating portion 90 by a degree high enough to increase visibility, the inventors have determined that the resin containing the light diffusing agent may have a light transmittance of not more than 60%. To achieve the signal-to-noise (S/N) ratio high enough to enable the photosensor 1 to detect a light blocking object, the inventors have determined that the resin may have a light transmittance of not less than 20%. Thus, the resin may have a light emittance of not less than 20% and not more than 60%. To achieve such light transmittance, the thicknesses H1, H2, and H3 and the concentration of the light diffusing agent in the resin are determined as follows. For example, the thickness H1 is in a range of 2.2 to 2.3 mm inclusive, the thickness H2 is in a range of 3.2 to 3.3 mm inclusive, and the thickness H3 is in a range of 2.2 to 2.3 mm inclusive. For example, the resin, which is transparent epoxy resin, contains the light diffusing agent, which is mainly composed of titanium oxide, at a concentration of not less than 0.3% by weight and not more than 0.7% by weight. In the photosensor fabricated to have the above specified values, the emitter-encapsulating portion 12, the receiver-encapsulating portion 17, and the operator indicator 92 including the thickness of the circuit-encapsulating portion 91 each have a light emittance of not less than 20% and not more than 60%.

Connecting Terminal

Referring to FIG. 8, the connecting terminals 50 include the power supply connecting terminal 51, a ground (GND) terminal 54, a first terminal 52, and a third terminal 53. The first terminal 52 and the third terminal 53 are collectively referred to as a first external connecting terminal. The first terminal 52 and the third terminal 53 protrude from the circuit-encapsulating portion 90. In other words, the first external connecting terminal protrudes from the circuit-encapsulating portion 90. The power supply connecting terminal 51 and the ground terminal 54 are collectively referred to as a second external connecting terminal. The power supply connecting terminal 51 and the ground terminal 54 protrude from the circuit-encapsulating portion 90. In other words, the second external connecting terminal protrudes from the circuit-encapsulating portion 90.

Figure 13:
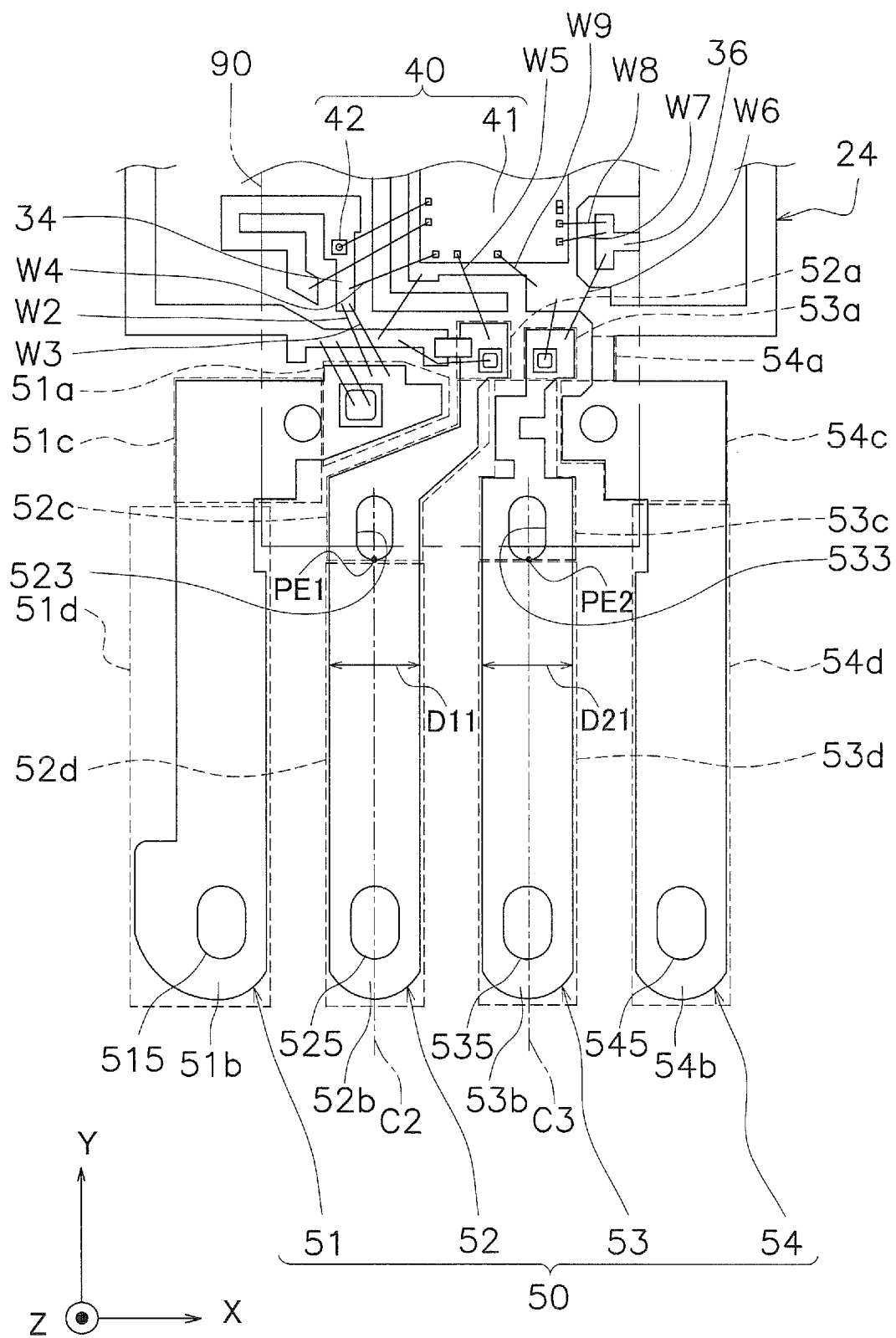
FIG. 13 is an enlarged view of a plurality of connecting terminals and their surrounding area.

FIG. 13 is an enlarged view of the connecting terminals 50 and their surrounding area. Referring to FIG. 13, the first terminal 52 includes a first circuit connector 52a, a first inner terminal 52c, and a first outer terminal 52d. The first circuit connector 52a is connected to the integrated circuit 41 with a wire W5. The first circuit connector 52a is a portion to which the wire W5 is connected. The first circuit connector 52a is, for example, a rectangular lead shown in FIG. 13. The first circuit connector 52a may not be rectangular as in FIG. 13.

The first inner terminal 52c extends from the first circuit connector 52a. More specifically, the first inner terminal 52c extends to the left (in the negative direction of X axis) and downward (in the negative direction of Y axis) from the first circuit connector 52a. As shown in FIG. 13, the upper end of the first inner terminal 52c meets the first circuit connector 52a. The lower end of the first inner terminal 52c is defined by a straight line including a lower distal end PE1 of a first through-hole 523 and perpendicular to the direction in which the first outer terminal 52d extends (the negative direction of Y axis). The first inner terminal 52c may extend in a direction different from the direction shown in FIG. 13. The first inner terminal 52c may have any shape when the width of its portion in contact with the circuit-encapsulating portion 90 (the length in the direction perpendicular to the direction in which the first inner terminal 52c extends or to the negative direction of Y axis) is smaller than the width of its lower end (the length in the direction perpendicular to the direction in which the first inner terminal 52c extends or to the negative direction of Y axis). The shape of the first inner terminal 52c will be described in detail below.

The first outer terminal 52d extends from the first inner terminal 52c. More specifically, the first outer terminal 52d extends downward (in the negative direction of Y axis) from the first inner terminal 52c. The first outer terminal 52d includes a first end 52b opposite to its end connected to the first inner terminal 52c. The first end 52b includes a second through-hole 525, which is used for soldering. The dimension D11 of the first outer terminal 52d in the direction perpendicular to the direction in which the first outer terminal 52d extends (X-axis direction) is uniform except for its curved portion around the first end 52b.

FIG. 14 is an enlarged view of the first inner terminal 52c. Referring to FIG. 14, the first inner terminal 52c includes a first portion 521, a second portion 522, and a third portion 524. The first portion 521 includes a first left portion 1521 and a first right portion 2521. The second portion 522 includes a second left portion 1522 and a second right portion 2522. The first portion 521, the second portion 522, and the third portion 524 define a first through-hole 523. In other words, the first inner terminal 52c includes the first through-hole 523.

The first portion 521, which is included in the first inner terminal 52c, is located outside the circuit-encapsulating portion 90. More specifically, the upper end of the first portion 521 is located where the first inner terminal 52c and the outline of the circuit-encapsulating portion 90 overlap as viewed in a direction perpendicular to the first plane (XY plane). The first left portion 1521 and the first right portion 2521 are located outside the circuit-encapsulating portion 90. The first left portion 1521, which is included in the first portion 521, is located to the left of the first through-hole 523. The first right portion 2521, which is included in the first portion 521, is located to the right of the first through-hole 523. The first portion 521 is adjacent to the first outer terminal 52d. In other words, the first left portion 1521 and the first right portion 2521 are adjacent to the first outer terminal 52d.

The second portion 522 is adjacent to the first portion 521 and is located inside the circuit-encapsulating portion 90. More specifically, the lower end of the second portion 522 is located where the first inner terminal 52c and the outline of the circuit-encapsulating portion 90 overlap as viewed in a direction perpendicular to the first plane (XY plane). The upper end of the second portion 522 is defined by a straight line including an upper distal end PE3 of a first through-hole 523 as viewed in a direction perpendicular to the direction in which the first inner terminal 52c extends (the negative direction of Y axis). The second left portion 1522, which is included in the second portion 522, is located to the left of the first through-hole 523. The second right portion 2522, which is included in the second portion 522, is located to the right of the first through-hole 523. In other words, the second left portion 1522 is adjacent to the first left portion 1521 and is located inside the circuit-encapsulating portion 90. The second right portion 2522 is adjacent to the first right portion 2521 and is located inside the circuit-encapsulating portion 90.

The third portion 524 is located nearer the first circuit connector 52a than the second portion 522. In other words, the third portion 524 is located nearer the first circuit connector 52a than the second left portion 1522 and the second right portion 2522. More specifically, the upper end of the third portion 524 meets the first circuit connector 52a. The lower end of the third portion 524 is defined by a straight line including an upper distal end PE3 of the first through-hole 523 and perpendicular to the direction in which the first inner terminal 52c extends (the negative direction of Y axis).

The dimension D12 of the first left portion 1521 in the direction perpendicular to the direction in which the first outer terminal 52c extends (X-axis direction) is smaller than the dimension D11 of the first outer terminal 52d in the direction perpendicular to the direction in which the first outer terminal 52d extends (X-axis direction). Likewise, the dimension D13 of the first right portion 2521 in the direction perpendicular to the first inner terminal 52c extends (X-axis direction) is smaller than the dimension D11 of the first outer terminal 52d in the direction perpendicular to the direction in which the first outer terminal 52d extends (X-axis direction). The dimension of the first portion 521 in the direction perpendicular to the direction in which the first inner terminal 52c extends (X-axis direction) is D12+D13. The dimension D12+D13 of the first portion 521 in the direction perpendicular to the direction in which the first inner terminal 52c extends (X-axis direction) is smaller than the dimension D11 of the first outer terminal 52d in the direction perpendicular to the direction in which the first outer terminal 52d extends (X-axis direction). The first outer terminal 52d is soldered when the connecting terminals 50 are connected to an external circuit. When the first outer terminal 52d is soldered, the heat is transmitted toward the first circuit connector 52a. With the dimension D12+D13 of the first portion 521 being smaller than the dimension D11 of the first outer terminal 52d, less heat is transmitted toward the first circuit connector 52a. This structure prevents the wire W5 from being disconnected by heat.

The dimension D14 of the second left portion 1522 in the direction perpendicular to the direction in which the first inner terminal 52c extends (X-axis direction) is smaller than the dimension D12 of the first left portion 1521 in the direction perpendicular to the direction in which the first inner terminal 52c extends (X-axis direction). Likewise, the dimension D15 of the second right portion 2522 in the direction perpendicular to the direction in which the first inner terminal 52c extends (X-axis direction) is smaller than the dimension D13 of the first right portion 2521 in the direction perpendicular to the direction in which the first inner terminal 52c extends (X-axis direction). The dimension D16 of the third portion 524 on its end meeting the second portion 522 in the direction perpendicular to the direction in which the first inner terminal 52c extends (X-axis direction) is larger than the dimension D14 of the second left portion 1522 in the direction perpendicular to the direction in which the first inner terminal 52c extends (X-axis direction). Likewise, the dimension D16 of the third portion 524 on its end meeting the second portion 522 in the direction perpendicular to the direction in which the first inner terminal 52c extends (X-axis direction) is larger than the dimension D15 of the second right portion 2522 in the direction perpendicular to the direction in which the first inner terminal 52c extends (X-axis direction). The dimension of the second portion 522 in the direction perpendicular to the direction in which the first inner terminal 52c extends (X-axis direction) is D14+D15. The dimension D16 of the third portion 524 on its end meeting the second portion 522 in the direction perpendicular to the direction in which the first inner terminal 52c extends (X-axis direction) is larger than the dimension D14+D15 of the second portion 522 in the direction perpendicular to the direction in which the first inner terminal 52c extends (X-axis direction). When the first outer terminal 52d is soldered, the heat transmitted to the second portion 522 can melt the resin portion touching the second portion 522. However, with the dimension D16 of the third portion 524 on its end meeting the second portion 522 being larger than the dimension D14+D15 of the second portion 522, the first terminal 52 is less likely to be detached from the circuit-encapsulating portion 90 if the resin portion touching the second portion 522 melts.

A portion of the first through-hole 523 is filled with the resin. The portion of the first through-hole 523 filled with the resin is referred to as a first hole encapsulator 93 (refer to FIG. 8). The first hole encapsulator 93 partially encapsulates the first through-hole 523. In other words, the first through-hole 523 has a portion not filled with resin. The circuit-encapsulating portion 90 is injection molded with the resin injected from an injection port (gate) G shown in FIG. 8. When the molding of the circuit-encapsulating portion 90 is complete, the gate G is removed, leaving a gate mark on the surface of the circuit-encapsulating portion 90 as an injection port corresponding portion 97. The injection port corresponding portion 97 is thus at a position corresponding to the resin injection port G, through which resin is injected for injection-molding the circuit-encapsulating portion 90 with resin. As shown in FIG. 8, the first hole encapsulator 93 is located on one end of the circuit-encapsulating portion 90, whereas the injection port corresponding portion 97 is located on the other end of the circuit-encapsulating portion 90. This structure can generate more voids (bubbles) in the first through-hole 523. If the dimension of the first portion 521 (D12+D13) is large, the first external connecting terminal will trap air, which forms bubbles. The first portion 521 with the dimension (D12+D13) smaller than the dimension D11 of the first outer terminal 52d reduces the likelihood that air will be trapped by the first external connecting terminal. Additionally, reducing the terminal width (D12+D13) reduces the area for trapping bubbles, and further reduces such bubbles causing insufficient resin filling. The first portion 521 may preferably be long enough in the direction in which the first inner terminal 52c extends to prevent burrs from forming in the process of injection-molding the circuit-encapsulating portion 90 with resin.

Referring to FIG. 13, the third terminal 53 includes a third circuit connector 53a, a third inner terminal 53c, and a third outer terminal 53d. The third circuit connector 53a is connected to the integrated circuit 41 with a wire W6, a third lead 36, which is a part of the main lead 30, and wires W7 and W8. The third circuit connector 53a is a portion to which the wire W6 is connected. The third circuit connector 53a is, for example, a rectangular lead shown in FIG. 13. The third circuit connector 53a may not be rectangular as in FIG. 13.

The third inner terminal 53c extends from the third circuit connector 53a. More specifically, the third inner terminal 53c extends downward (in the negative direction of Y axis) in a staggered manner on a plane from the third circuit connector 53a. As shown in FIG. 13, the upper end of the third inner terminal 53c meets the third circuit connector 53a. The lower end of the third inner terminal 53c is defined by a straight line including a lower distal end PE2 of a third through-hole 533 perpendicular to the direction in which the third outer terminal 53d extends (in the negative direction of Y axis). The third inner terminal 53c may extend in a direction different from the direction shown in FIG. 13. The third inner terminal 53c may have any shape when the width of its portion in contact with the circuit-encapsulating portion 90 (the length in the direction perpendicular to the direction in which the third inner terminal 53c extends or to the negative direction of Y axis) is smaller than the width of its lower end (the length in the direction perpendicular to the direction in which the third inner terminal 53c extends or to the negative direction of Y axis). The shape of the third inner terminal 53c will be described in detail below.

The third outer terminal 53d extends from the third inner terminal 53c. More specifically, the third outer terminal 53d extends downward (in the negative direction of Y axis) from the third inner terminal 53c. The third outer terminal 53d includes a third end 53b opposite to its end connected to the third inner terminal 53c. The third end 53b includes a fourth through-hole 535, which is used for soldering. The dimension D21 of the third outer terminal 53d in the direction perpendicular to the direction in which the third outer terminal 53d extends (X-axis direction) is uniform except for its curved portion around the third end 53b.

FIG. 14 is an enlarged view of the third inner terminal 53c. Referring to FIG. 14, the third inner terminal 53c includes a fourth portion 531, a fifth portion 532, and a sixth portion 534. The fourth portion 531 includes a fourth left portion 1531 and a fourth right portion 2531. The fifth portion 532 includes a fifth left portion 1532 and a fifth right portion 2532. The fourth portion 531, the fifth portion 532, and the sixth portion 534 define a third through-hole 533. In other words, the third inner terminal 53c includes the third through-hole 533.

The fourth portion 531, which is included in the third inner terminal 53c, is located outside the circuit-encapsulating portion 90. More specifically, the upper end of the fourth portion 531 is located where the third inner terminal 53c and the outline of the circuit-encapsulating portion 90 overlap as viewed in the direction perpendicular to the first plane (XY plane). The fourth left portion 1531 and the fourth right portion 2531 are located outside the circuit-encapsulating portion 90. The fourth left portion 1531, which is included in the fourth portion 531, is located to the left of the third through-hole 533. The fourth right portion 2531, which is included in the fourth portion 531, is located to the right of the third through-hole 533. The fourth portion 531 is adjacent to the third outer terminal 53d. In other words, the fourth left portion 1531 and the fourth right portion 2531 are adjacent to the third outer terminal 53d.

The fifth portion 532 is adjacent to the fourth portion 531 and is located inside the circuit-encapsulating portion 90. More specifically, the lower end of the fifth portion 532 is located where the third inner terminal 53c and the outline of the circuit-encapsulating portion 90 overlap as viewed in the direction perpendicular to the first plane (XY plane). The upper end of the fifth portion 532 is defined by a straight line including an upper distal end PE4 of a third through-hole 533 as viewed in a direction perpendicular to the direction in which the third inner terminal 53c extends (the negative direction of Y axis). The fifth left portion 1532, which is included in the fifth portion 532, is located to the left of the third through-hole 533. The fifth right portion 2532, which is included in the fifth portion 532, is located to the right of the third through-hole 533. In other words, the fifth left portion 1532 is adjacent to the fourth left portion 1531 and is located inside the circuit-encapsulating portion 90. The fifth right portion 2532 is adjacent to the fourth right portion 2531 and is located inside the circuit-encapsulating portion 90.

The sixth portion 534 is located nearer the third circuit connector 53a than the fifth portion 532. In other words, the sixth portion 534 is located nearer the third circuit connector 53a than the fifth left portion 1532 and the fifth right portion 2532. More specifically, the upper end of the sixth portion 534 meets the third circuit connector 53a. The lower end of the sixth portion 534 is defined by a straight line including the upper distal end PE4 of the third through-hole 533 and perpendicular to the direction in which the third inner terminal 53c extends (to the negative direction of Y axis).

The dimension D22 of the fourth left portion 1531 in the direction perpendicular to the direction in which the third outer terminal 53c extends (X-axis direction) is smaller than the dimension D21 of the third outer terminal 53d in the direction perpendicular to the direction in which the third outer terminal 53d extends (X-axis direction). Likewise, the dimension D23 of the fourth right portion 2531 in the direction perpendicular to the direction in which the third outer terminal 53c extends (X-axis direction) is smaller than the dimension D21 of the third outer terminal 53d in the direction perpendicular to the direction in which the third outer terminal 53d extends (X-axis direction). The dimension of the fourth portion 531 in the direction perpendicular to the direction in which the third inner terminal 53c extends (X-axis direction) is D22+D23. The dimension D22+D23 of the fourth portion 531 in the direction perpendicular to the direction in which the third inner terminal 53c extends (X-axis direction) is smaller than the dimension D21 of the third outer terminal 53d in the direction perpendicular to the direction in which the third outer terminal 53d extends (X-axis direction). The third outer terminal 53d is soldered when the connecting terminals 50 are connected to an external circuit. When the third outer terminal 53d is soldered, the heat is transmitted toward the third circuit connector 53a. With the dimension D22+D23 of the fourth portion 531 being smaller than the dimension D21 of the third outer terminal 53d, less heat is transmitted toward the third circuit connector 53a. This structure prevents the wires W6 and W7 from being disconnected by heat.

The dimension D24 of the fifth left portion 1532 in the direction perpendicular to the direction in which the third inner terminal 53c extends (X-axis direction) is smaller than the dimension D22 of the fourth left portion 1531 in the direction perpendicular to the direction in which the third inner terminal 53c extends (X-axis direction). Likewise, the dimension D25 of the fifth right portion 2532 in the direction perpendicular to the direction in which the third inner terminal 53c extends (X-axis direction) is smaller than the dimension D23 of the fourth right portion 2531 in the direction perpendicular to the direction in which the third inner terminal 53c extends (X-axis direction). The dimension D26 of the sixth portion 534 in the direction perpendicular to the direction in which the third inner terminal 53c extends (X-axis direction) is larger than the dimension D24 of the fifth left portion 1532 in the direction perpendicular to the direction in which the third inner terminal 53c extends (X-axis direction). The dimension D26 of the sixth portion 534 in the direction perpendicular to the direction in which the third inner terminal 53c extends (X-axis direction) is larger than the dimension D25 of the fifth right portion 2532 in the direction perpendicular to the direction in which the third inner terminal 53c extends (X-axis direction). The dimension of the fifth portion 532 in the direction perpendicular to the direction in which the third inner terminal 53c extends (X-axis direction) is D24+D25. The dimension D26 of the sixth portion 534 in the direction perpendicular to the direction in which the third inner terminal 53c extends (X-axis direction) is larger than the dimension D24+D25 of the fifth portion 532 in the direction perpendicular to the direction in which the third inner terminal 53c extends (X-axis direction). When the third outer terminal 53d is soldered, the heat transmitted to the fifth portion 532 can melt the resin portion touching the fifth portion 532. However, with the dimension D26 of the sixth portion 534 being larger than the dimension D24+D25 of the fifth portion 532, the third terminal 53 is less likely to be detached from the circuit-encapsulating portion 90 if the resin portion touching the fifth portion 532 melts.

A portion of the third through-hole 533 is filled with the resin. The portion of the third through-hole 533 filled with the resin is referred to as a third hole encapsulator 94 (refer to FIG. 8). The third hole encapsulator 94 partially encapsulates the third through-hole 533. In other words, the third through-hole 533 has a portion not filled with resin. The third hole encapsulator 94 is located on one end of the circuit-encapsulating portion 90, whereas the injection port corresponding portion 97 is located on the other end of the circuit-encapsulating portion 90. This structure can generate more voids (bubbles) in the third through-hole 533. If the dimension of the fourth portion 531 (D22+D23) is large, the first external connecting terminal will trap air, which forms bubbles. The fourth portion 531 with the dimension (D22+D23) smaller than the dimension D21 of the third outer terminal 53d reduces the likelihood that air will be trapped by the first external connecting terminal. Additionally, reducing the terminal width (D22+D23) reduces the area for to trapping bubbles, and further reduces such bubbles causing insufficient resin filling. The fourth portion 531 may preferably be long enough in its direction in which the third inner terminal 53c extends to prevent burrs from forming in the process of injection-molding the circuit-encapsulating portion 90 with resin.

Referring to FIG. 13, the power supply terminal 51 includes a second circuit connector 51a, a second inner terminal 51c, and a second outer terminal 51d. The second circuit connector 51a is connected to the integrated circuit 41 with the wires W2 and W3, the second lead 34, and the wire W4. The second inner terminal 51c extends from the second circuit connector 51a. More specifically, the second inner terminal 51c extends to the left (in the negative direction of X axis) from the second circuit connector 51a. The second outer terminal 51d extends from the second inner terminal 51c. More specifically, the second outer terminal 51d extends downward (in the negative direction of Y axis) from the second inner terminal 51c. The second outer terminal 51d includes a second end 54b opposite to its end connected to the fourth terminal 54c. The second end 51b includes a fifth through-hole 515, which is used for soldering. The dimension of the second outer terminal 51d in the direction perpendicular to the direction in which the second outer terminal 51d extends (X-axis direction) is substantially uniform.

The ground terminal 54 includes a fourth circuit connector 54a, a fourth inner terminal 54c, and a fourth outer terminal 54d. The fourth circuit connector 54a is connected to the integrated circuit 41 with the first receiver lead 24 and a wire W9. The fourth inner terminal 54c extends from the fourth circuit connector 54a. More specifically, the fourth inner terminal 54c extends downward (in the negative direction of Y axis) and to the right (the positive direction of X axis) from the fourth circuit connector 54a. The fourth outer terminal 54d extends from the fourth inner terminal 54c. More specifically, the fourth outer terminal 54d extends downward (in the negative direction of Y axis) from the fourth inner terminal 54c. The fourth outer terminal 54d includes a fourth end 54b opposite to its end connected to the fourth terminal 54c. The fourth end 54b includes a sixth through-hole 545, which is used for soldering. The dimension of the fourth outer terminal 54d in the direction perpendicular to the direction in which the fourth outer terminal 54d extends (X-axis direction) is substantially uniform.

The distance between the second through-hole 525 and the first circuit connector 52a is smaller than the distance between the fifth through-hole 515 and the second circuit connector 51a. Likewise, the distance between the fourth through-hole 535 and the third circuit connector 53a is smaller than the distance between the fifth through-hole 515 and the second circuit connector 51a. Further, the distance between the second through-hole 525 and the first circuit connector 52a is smaller than the distance between the sixth through-hole 545 and the fourth circuit connector 54a. Likewise, the distance between the fourth through-hole 535 and the third circuit connector 53a is smaller than the distance between the sixth through-hole 545 and the fourth circuit connector 54a. The distance between the two parts does not refer to a distance on a straight line joining the two parts, but refers to the smallest distance on the lead joining the two parts. Each of the power supply terminal 51 and the ground terminal 54 has a long distance from its end to the circuit connector, and thus easily cools when heat is transmitted from the end to the circuit connector. In contrast, each of the first terminal 52 and the third terminal 53 has a small distance from its end to the circuit connector, and thus does not easily cool when heat is transmitted from the end to the circuit connector. To reduce heat transmission, the first terminal 52 has the first through-hole 523, and the third terminal 53 has the third through-hole 533.

The surface area of the first terminal 52 is smaller than the surface area of each of the power supply terminal 51 and the ground terminal 54. The surface area of the third terminal 53 is smaller than the surface area of each of the power supply terminal 51 and the ground terminal 54. Each of the power supply terminal 51 and the ground terminal 54 has a large surface area, and thus can cool easily when heat is transmitted from its end toward the circuit connector. In contrast, each of the first terminal 52 and the third terminal 53 has a small surface area, and thus does not cool easily when heat is transmitted from its end to the circuit connector. To reduce heat transmission, the first terminal 52 has the first through-hole 523, and the third terminal 53 has the third through-hole 533.

As described above, the first outer terminal 52d and the third outer terminal 53d extend in the same direction and have the same shape. The widths of the first inner terminal 52c and the third inner terminal 53c on their sides in contact with the circuit-encapsulating portion 90 are narrower than the widths of the first inner terminal 52c and the third inner terminal 53c on their lower ends. Thus, the first circuit connector 52a and the third circuit connector 53a may be replaced with each other. The first inner terminal 52c and the third inner terminal 53c may be replaced with each other. The first outer terminal 52d and the third outer terminal 53d may be replaced with each other. The first end 52b and the third end 53b may be replaced with each other. The first portion 521 and the fourth portion 531 may be replaced with each other. The second portion 522 and the fifth portion 532 may be replaced with each other. The third portion 524 and the sixth portion 534 may be replaced with each other. The first through-hole 523 and the third through-hole 533 may be replaced with each other. The first hole encapsulator 93 and the third hole encapsulator 94 may be replaced with each other.

Likewise, the second outer terminal 51d and the fourth outer terminal 54d extend in the same direction. Thus, the second circuit connector 51a and the fourth circuit connector 54a may be replaced with each other. The second inner terminal 51c and the fourth inner terminal 54c may be replaced with each other. The second outer terminal 51d and the fourth outer terminal 54d may be replaced with each other. The first inner terminal 52c and the third inner terminal 53c may not have the through-holes 523 and 533. FIGS. 15A and FIG. 15B show first inner terminals and third inner terminals according to modifications of the present embodiment. As shown in FIG. 15A(a), for example, a first terminal 152 includes a first inner terminal 152c, a first circuit connector 52a, and a first outer terminal 52d. The first inner terminal 152c includes a first left portion 1521 and a second left portion 1522. A third terminal 153 includes a third inner terminal 153c, a third circuit connector 53a, and a third outer terminal 53d. The third inner terminal 153c includes a fourth left portion 1531 and a fifth left portion 1532. As shown in FIG. 15A(b), a first terminal 252 includes a first inner terminal 252c, a first circuit connector 52a, and a first outer terminal 52d. The first terminal 252 includes a first right portion 2521 and a second right portion 2522. A third terminal 253 includes a third inner terminal 253c, a third circuit connector 53a, and a third outer terminal 53d. The third inner terminal 253c includes a fourth right portion 2531 and a fifth right portion 2532. This structure also reduces the likelihood that air is trapped by the first external connecting terminal, and reduces insufficient resin filling.

In another example FIG. 15B(c), a first terminal 352 includes a first inner terminal 352c, a first circuit connector 52a, and a first outer terminal 52d. The first inner terminal 352c includes a first left portion 1521, a second left portion 1522, and a third portion 524. A third terminal 353 includes a third inner terminal 353c, a third circuit connector 53a, and a third outer terminal 53d. The third inner terminal 353c includes a fourth left portion 1531, a fifth left portion 1532, and a sixth portion 534. In still another example shown in FIG. 15B(d), a first terminal 452 includes a first inner terminal 452c, a first circuit connector 52a, and a first outer terminal 52d. The first inner terminal 452c includes a first right portion 2521, a second right portion 2522, and a third portion 524. A third terminal 453 includes a third inner terminal 453c, a third circuit connector 53a, and a third outer terminal 53d. The third inner terminal 453c includes a fourth right portion 2531, a fifth right portion 2532, and a sixth portion 534. These structures reduce the likelihood that air is trapped by the external connecting terminal and reduce insufficient resin filling, and further prevent the first terminals 352 and 452 and the third terminals 353 and 453 from easily detaching from the circuit-encapsulating portion 90 when the resin on the second portion or the fifth portion melts.

The photosensor of the present invention may include any of the first terminals 52, 152, 252, 352, and 452 as its first terminal, and any of the third terminals 53, 153, 253, 353, and 453 as its third terminal.

Emitter Lead and Receiver Lead

With the limited arrangement of pins of the integrated circuit 41 in the circuit-encapsulating portion 90, the sensor module 5 includes the emitter leads 20 and 22 and the receiver leads 24 and 26 that protrude to the left and to the right. The sensor module 5 can be mounted on a flat (straight) type or an outer L-shaped type. The first emitter lead 20, the second emitter lead 22, the first receiver lead 24, and the second receiver lead 26 have the characteristics described below. As shown in FIG. 7, the first emitter lead 20 includes a first emitter lead portion 202, a second emitter lead portion 204, a third emitter lead portion 206, a fourth emitter lead portion 208, and a fifth emitter lead portion 210.

As shown in FIG. 6, the first emitter lead portion 202 protrudes in a direction parallel to the first plane (XY plane) described above and intersecting with the first direction described above (the negative direction of Y axis) from the circuit-encapsulating portion 90 and extends in a direction opposite to the first direction. More specifically, the first emitter lead portion 202 includes a first emitter lead protrusion 202a, a first bending portion 202c, and a first emitter lead extension 202b. The first emitter lead protrusion 202a protrudes in the direction parallel to the first plane and intersecting with the first direction from the circuit-encapsulating portion 90. The first bending portion 202c joins the first emitter lead protrusion 202a and the first emitter lead extension 202b. The first emitter lead extension 202b extends from the first bending portion 202c to the first outer end 204b of the second emitter lead portion 204 in a direction opposite to the first direction (the positive direction of Y axis). The first emitter lead protrusion 202a is long enough (about 0.3 to 0.4 mm) to allow deburring after the process of injection-molding the circuit-encapsulating portion 90.

The second emitter lead portion 204 includes a first outer end 204b, a first inner end 204a, and a first straight portion 204c. The first outer end 204b joins the first emitter lead extension 202b and the first straight portion 204c. The first outer end 204b is bent. The first straight portion 204c extends inward in the optical axis direction (X-axis direction) from the first outer end 204b to the first inner end 204a. Being inward refers to being toward the plane C1 described above in the optical axis direction (X-axis direction). Being outward refers to being away from the plane C1 in the optical axis direction (X-axis direction). The first inner end 204a joins the first straight portion 204c and the third emitter lead portion 206. The first inner end 204a is bent. The third emitter lead portion 206 is connected to the second emitter lead portion 204. More specifically, the third emitter lead portion 206 extends in the direction opposite to the first direction (the positive direction of Y axis) from the first inner end 204a to a second inner end 208a (described later) of the fourth emitter lead portion 208.

The fourth emitter lead portion 208 includes a second outer end 208b, a second inner end 208a, and a second straight portion 208c. The second inner end 208a joins the third emitter lead portion 206 and the second straight portion 208c. The second inner end 208a is bent. The second straight portion 208c extends outward in the optical axis direction (X-axis direction) from the second inner end 208a to the second outer end 208b. Referring to FIG. 7, the fourth emitter lead portion 208 is bent at its first bending portion B1 to allow the light emitter 10 and the light receiver 15 to face each other. As shown in FIG. 6, the fourth emitter lead portion 208 is bent at the first bending portion B1 so that the first bending portion B1 and the second outer end 208b overlap with each other as viewed in the direction perpendicular to the first plane (XY plane). As shown in FIG. 6, the first inner end 204a is located more inward than the second outer end 208b as viewed in the optical axis direction (X-axis direction). In the optical axis direction, the second inner end 208a is located more inward than the first outer end 204b. This positional relationship results from the third emitter lead portion 206 arranged inward to allow the first bending portion B1 to have a sufficient margin for bending in the fourth emitter lead portion 208.

The second outer end 208b joins the second straight portion 208c and the fifth emitter lead portion 210. The second outer end 208b is bent. The fifth emitter lead portion 210 is connected to the second outer end 208b. The fifth emitter lead portion 210 bends and extends in the direction opposite to the first direction (the positive direction of Y axis) from the second outer end 208b to the light emitter 10.

Referring to FIGS. 6 and 7, the second emitter lead 22 is located more inward than the first emitter lead 20 in the optical axis directions (X-axis direction). The second emitter lead 22 includes a sixth emitter lead 222, a third bending portion 223, a seventh emitter lead portion 224, a fourth bending portion 225, an eighth emitter lead portion 226, a fifth bending portion 227, a ninth emitter lead 228, a sixth bending portion 229, a tenth emitter lead portion 230, a seventh bending portion 231, an eleventh emitter lead 232, an eighth bending portion 233, and a twelfth emitter lead 234.

The sixth emitter lead 222 protrudes in the direction parallel to the first plane (XY plane) and intersecting with the first direction (the negative direction of Y axis) from the circuit-encapsulating portion 90, and extends in the direction opposite to the first direction. More specifically, the sixth emitter lead 222 includes a sixth emitter lead protrusion 222a, a second bending portion 222c, and a sixth emitter lead extension 222b. The sixth emitter lead protrusion 222a protrudes in the direction parallel to the first plane and intersecting with the first direction from the circuit-encapsulating portion 90. The second bending portion 222c joins the sixth emitter lead protrusion 222a and the sixth emitter lead extension 222b. The sixth emitter lead extension 222b extends from the second bending portion 222c to the third bending portion 223 in the direction opposite to the first direction (the positive direction of Y axis). The sixth emitter lead protrusion 222a is long enough (about 0.3 to 0.4 mm) to allow deburring after the process of injection-molding the circuit-encapsulating portion 90. As shown in FIG. 6, the distance D1 between the second emitter lead 22 and the first emitter lead portion 202 (specifically, the distance D1 between the sixth emitter lead extension 222b and the first emitter lead extension 202b) is set to prevent contact between and achieve insulation between the first emitter lead 20 and the second emitter lead 22.

The third bending portion 223 joins the sixth emitter lead 222 and the seventh emitter lead portion 224. The seventh emitter lead portion 224 extends in the direction opposite to the first direction (the negative direction of Y axis) and inward from the third bending portion 223 to the fourth bending portion 225. The seventh emitter lead portion 224 corresponds to an inclined light emitting portion, which is inclined to increase its distance to the first emitter lead portion 202 in the optical axis direction.

The fourth bending portion 225 joins the seventh emitter lead portion 224 and the eighth emitter lead portion 226. The eighth emitter lead portion 226 is connected to the seventh emitter lead portion 224. More specifically, the eighth emitter lead portion 226 extends in the direction opposite to the first direction (the positive direction of Y axis) from the fourth bending portion 225 to the fifth bending portion 227. As shown in FIG. 6, the distance D2 between the second emitter lead 22 and the third emitter lead portion 206 (specifically, the distance D2 between the eighth emitter lead portion 226 and the third emitter lead portion 206) is set to prevent contact between and achieve insulation between the first emitter lead 20 and the second emitter lead 22. The distance D2 between the second emitter lead 22 and the third emitter lead portion 206 is smaller than the distance D1 between the second emitter lead 22 and the first emitter lead portion 202. This results from the third emitter lead portion 206 arranged most inward to allow the first bending portion B1 (described below) to have a sufficient margin for bending in the fourth emitter lead portion 208.

The fifth bending portion 227 joins the eighth emitter lead portion 226 and the ninth emitter lead 228. The ninth emitter lead 228 extends outward in the optical axis direction (X-axis direction) (in the direction opposite to the direction in which the seventh emitter lead portion 224 is inclined with respect to the optical axis direction, or the X-axis direction) from the fifth bending portion 227 to the sixth bending portion 229. The sixth bending portion 229 joins the ninth emitter lead 228 and the tenth emitter lead portion 230. The tenth emitter lead portion 230 is connected to the ninth emitter lead 228. More specifically, the tenth emitter lead portion 230 extends from the sixth bending portion 229 to the seventh bending portion 231 in the direction opposite to the first direction (the positive direction of Y axis). The seventh bending portion 231 joins the tenth emitter lead portion 230 and the eleventh emitter lead 232. The eleventh emitter lead 232 extends in the direction opposite to the first direction (the negative direction of Y axis) and inward from the seventh bending portion 231 to the eighth bending portion 233. The eleventh emitter lead 232 is inclined to increase its distance to the first emitter lead 20 in the optical axis direction. The eighth bending portion 233 joins the eleventh emitter lead 232 and the twelfth emitter lead 234. The twelfth emitter lead 234 is connected to the eighth bending portion 233 and extends in the direction opposite to the first direction (the positive direction of Y axis) to the light emitter 10.

As shown in FIGS. 6 and 7, the first receiver lead 24 includes a first receiver lead portion 242, a second receiver lead portion 244, a third receiver lead portion 246, a fourth receiver lead portion 248, and a fifth receiver lead portion 250.

As shown in FIG. 6, the first receiver lead portion 242 protrudes from the circuit-encapsulating portion 90 in the direction parallel to the first plane (XY plane) and intersecting with the first direction (the negative direction of Y axis) and in the direction opposite to the direction in which the first emitter lead 20 and the second emitter lead 22 protrude. More specifically, the first receiver lead portion 242 includes a first receiver lead protrusion 242a, a ninth bending portion 242c, and a first receiver extension 242b. The first receiver lead protrusion 242a protrudes in the direction parallel to the first plane and intersecting with the first direction from the circuit-encapsulating portion 90 to the first bending portion 202c. The first bending portion 202c joins the first receiver lead protrusion 242a and the first receiver lead protrusion 242a. The first receiver extension 242b extends in the direction opposite to the first direction (the positive direction of Y axis) from the first bending portion 202c to the outer end 244b of the second receiver lead portion 244. The sixth emitter lead protrusion 222a is long enough (about 0.3 to 0.4 mm) to allow deburring after the process of injection-molding the circuit-encapsulating portion 90.

The second receiver lead portion 244 includes a third outer end 244b, a third inner end 244a, and a third straight portion 244c. The third outer end 244b joins the first receiver extension 242b and the third straight portion 244c. The third outer end 244b is bent. The third straight portion 244c extends inward in the optical axis direction (X-axis direction) from the third outer end 244b to the third inner end 244a. The third inner end 244a joins the third straight portion 244c and the third receiver lead portion 246. The third inner end 244a is bent. The third receiver lead portion 246 is connected to the second receiver lead portion 244. More specifically, the third receiver lead portion 246 extends in the direction opposite to the first direction (the positive direction of Y axis) from the third inner end 244a to a fourth inner end 248a (described below) of the fourth receiver lead portion 248.

The fourth receiver lead portion 248 includes a fourth outer end 248b, a fourth inner end 248a, and a fourth straight portion 248c. The fourth inner end 248a joins the third receiver lead portion 246 and the fourth straight portion 248c. The fourth inner end 248a is bent. The fourth straight portion 248c extends outward in the optical axis direction (X-axis direction) from the fourth inner end 248a to the fourth outer end 248b. Referring to FIG. 7, the fourth receiver lead portion 248 is bent at its second bending portion B2 to allow the light emitter 10 and the light receiver 15 to face each other. As shown in FIG. 6, the fourth receiver lead portion 248 is bent at the second bending portion B2 so that the second bending portion B2 and the fourth outer end 248b overlap with each other as viewed in the direction perpendicular to the first plane (XY plane). As shown in FIG. 6, the first inner end 244a of the second receiver portion 244 is located more inward than the fourth outer end 248b in the optical axis direction (X-axis direction). In the optical axis direction, the fourth inner end 248a is located more inward than the third outer end 244b. This positional relationship results from the third receiver lead portion 246 arranged inward to allow the second bending portion B2 to have a sufficient margin for bending in the fourth receiver lead portion 248.

The fourth outer end 248b joins the fourth straight portion 248c and the fifth receiver lead portion 250. The fourth outer end 248b is bent. The fifth receiver lead portion 250 is connected to the fourth outer end 248b. The fifth receiver lead portion 250 bends and extends in the direction opposite to the first direction (the positive direction of Y axis) from the fourth outer end 248b to the light receiver 15.

Referring to FIGS. 6 and 7, the second receiver lead 26 is located more inward than the first receiver lead 24 in the optical axis direction (X-axis direction). The second receiver lead 26 includes a sixth receiver lead portion 262, an eleventh bending portion 263, a seventh receiver lead portion 264, a twelfth bending portion 265, an eighth receiver lead portion 266, a thirteenth bending portion 267, a ninth receiver lead portion 268, a fourteenth bending portion 269, a tenth receiver lead portion 270, a fifteenth bending portion 271, an eleventh receiver lead portion 272, a sixteenth bending portion 273, and a twelfth receiver lead portion 274.

The sixth receiver lead portion 262 protrudes from the circuit-encapsulating portion 90 in the direction parallel to the first plane (XY plane) and intersecting with the first direction (the negative direction of Y axis) and in the direction opposite to the direction in which the first emitter lead 20 and the second emitter lead 22 protrude, and in the direction opposite to the first direction. More specifically, the sixth receiver lead portion 262 includes a sixth receiver lead protrusion 262a, a tenth bending portion 262c, and a sixth receiver extension 262b. The sixth receiver lead protrusion 262a protrudes from the circuit-encapsulating portion 90 in the direction parallel to the first plane and intersecting with the first direction and in the direction opposite to the direction in which the first emitter lead 20 and the second emitter lead 22 protrude. The tenth bending portion 262c joins the sixth receiver lead protrusion 262a and the sixth receiver extension 262b. The sixth receiver extension 262b extends in the direction opposite to the first direction from the tenth bending portion 262c to the eleventh bending portion 263. The sixth receiver lead protrusion 262a is long enough (about 0.3 to 0.4 mm) to allow deburring after the process of injection-molding the circuit-encapsulating portion 90. As shown in FIG. 6, the distance D3 between the second receiver lead 26 and the first receiver lead portion 242 (specifically, the distance D3 between the sixth receiver extension 262b and the first receiver extension 242b) is set to prevent contact between and achieve insulation between the first emitter lead 20 and the second emitter lead 22.

The eleventh bending portion 263 joins the sixth receiver lead portion 262 and the seventh receiver lead portion 264. The seventh receiver lead portion 264 extends in the direction opposite to the first direction (the negative direction of Y axis) and inward from the eleventh bending portion 263 to the twelfth bending portion 265. The seventh receiver lead portion 264 corresponds to an inclined light receiving portion, which is inclined to increase its distance to the sixth receiver lead portion 262 in the optical axis direction.

The twelfth bending portion 265 joins the seventh receiver lead portion 264 and the eighth receiver lead portion 266. The eighth receiver lead portion 266 is connected to the seventh receiver lead portion 264. More specifically, the eighth receiver lead portion 266 extends in the direction opposite to the first direction (the positive direction of Y axis) from the twelfth bending portion 265 to the thirteenth bending portion 267. As shown in FIG. 6, the distance D4 between the second receiver lead 26 and the third receiver lead portion 246 (specifically, the distance D4 between the eighth receiver lead portion 266 and the third receiver lead portion 246) is set to prevent contact between and achieve insulation between the first receiver lead 20 and the second receiver lead 22. The distance D4 between the second receiver lead 26 and the third receiver lead portion 246 is smaller than the distance D3 between the second receiver lead 26 and the first receiver lead portion 242. This results from the third receiver lead portion 246 arranged most inward to allow the second bending portion B2 (described below) to have a sufficient margin for bending in the fourth receiver lead portion 208.

The thirteenth bending portion 267 joins the eighth receiver lead portion 266 and the ninth receiver lead portion 268. The ninth receiver lead portion 268 extends outward in the optical axis direction (X-axis direction) (the direction opposite to the direction in which the seventh receiver lead portion 264 is inclined with respect to the optical axis direction or the X-axis direction) from the thirteenth bending portion 267 to the fourteenth bending portion 269. The fourteenth bending portion 269 joins the ninth receiver lead portion 268 and the tenth receiver lead portion 270. The tenth receiver lead portion 270 is connected to the ninth receiver lead portion 268. More specifically, the tenth receiver lead portion 270 extends in the direction opposite to the first direction (the positive direction of Y axis) from the fourteenth bending portion 269 to the fifteenth bending portion 271. The fifteenth bending portion 271 joins the tenth receiver lead portion 270 and the eleventh receiver lead portion 272. The eleventh receiver lead portion 272 extends in the direction opposite to the first direction (the negative direction of Y axis) and inward from the fifteenth bending portion 271 to the sixteenth bending portion 273. The eleventh receiver lead portion 272 is inclined to increase its distance to the first receiver lead 24 in the optical axis direction. The sixteenth bending portion 273 joins the eleventh receiver lead portion 272 and the twelfth receiver lead portion 274. The twelfth receiver lead portion 274 is connected to the eighth bending portion 233, and extends in the direction opposite to the first direction (the positive direction of Y axis) to the light emitter 10.

To shape the primary molded piece (sensor module 4) of the sensor module 5 shown in FIG. 7 into the structure shown in FIG. 6 in which the light emitter 10 and the light receiver 15 face each other, the first emitter lead 20 and the second emitter lead 22 are bent along a first bending line L1. The first receiver lead 24 and the second receiver lead 26 are bent along a second bending line L2. The first bending line L1 is parallel to a second direction (Y-axis direction) that is perpendicular to the optical axis. The second bending line L2 is also parallel to the second direction (Y-axis direction). More specifically, the fourth emitter lead portion 208 includes the first bending portion B1, which is bent along the first bending line L1. The fourth receiver lead portion 248 includes the second bending portion B2, which is bent along the second bending line L2. The ninth emitter lead 228 includes the third bending portion B3, which is bent along the first bending line L1. The ninth receiver lead portion 268 includes a fourth bending portion B4, which is bent along the second bending line L2.

As shown in FIG. 7, when the first emitter lead 20 and the second emitter lead 22 are unfolded in a plane without bending along the first bending line L1, the unfolded first emitter lead 20 and the unfolded second emitter lead 22 extend across the first bending line L1. When the first receiver lead 24 and the second receiver lead 26 are unfolded in a plane without bending along the second bending line L2, the unfolded first receiver lead 24 and the unfolded second receiver lead 26 extend across the second bending line L2.

The first emitter lead 20, the second emitter lead 22, the first receiver lead 24, and the second receiver lead 26 are wide enough (e.g., not less than 0.5 mm) to have strength to bend and also to support the light emitter 10 and the light receiver 15. To have such strength, the first emitter lead 20, the second emitter lead 22, the first receiver lead 24, and the second receiver lead 26 are preferably formed from a copper alloy, gold, silver, or a nickel alloy. The distance between the fifth emitter lead portion 210 and the eighth emitter lead portion 226 in the optical axis direction is smaller than the total of a vertical width D31 and a horizontal width D32 of the emitter case section 62 (refer to FIG. 2). The distance between the fifth receiver lead portion 250 and the eighth receiver lead portion 266 in the optical axis direction is smaller than the total of a vertical width D31 and a horizontal width D33 of the receiver case section 63 (refer to FIG. 2). This structure allows the emitter case section 62 and the receiver case section 63, which satisfy the industry standards, to accommodate the emitter leads 20 and 22 and the receiver leads 24 and 26.

The shapes of the first emitter lead 20, the second emitter lead 22, the first receiver lead 24, and the second receiver lead 26 shown in FIGS. 6 to 8 are mere examples. The first emitter lead 20, the second emitter lead 22, the first receiver lead 24, and the second receiver lead 26 may be in any shapes that can satisfy the four conditions described below.

Condition 1: For the unfolded first emitter lead 20 as shown in FIG. 7, the maximum distance between the first emitter lead 20 and the bending line L1 in the X-axis direction (the distance between the fifth emitter lead portion 210 and the bending line L1 in the X-axis direction) is smaller than the vertical width D31 of the emitter case section 62 shown in FIG. 2.

Condition 2: For the unfolded second emitter lead 22 as shown in FIG. 7, the maximum distance between the second emitter lead 22 and the bending line L1 in the X-axis direction (the distance between the eighth emitter lead portion 226 and the bending line L1 in the X-axis direction) is smaller than the horizontal width D32 of the emitter case section 62 shown in FIG. 2.

Condition 3: For the unfolded first receiver lead 24 as shown in FIG. 7, the maximum distance between the first receiver lead 24 and the bending line L2 in the X-axis direction (the distance between the fifth receiver lead portion 250 and the bending line L2 in the X-axis direction) is smaller than the vertical width D31 of the receiver case section 63 shown in FIG. 2.

Condition 4: For the unfolded second receiver lead 26 as shown in FIG. 7, the maximum distance between the second receiver lead 26 and the bending line L2 in the X-axis direction (the distance between the eighth receiver lead portion 266 and the bending line L2 in the X-axis direction) is smaller than the horizontal width D33 of the receiver case section 63 shown in FIG. 2.

Figure 16:
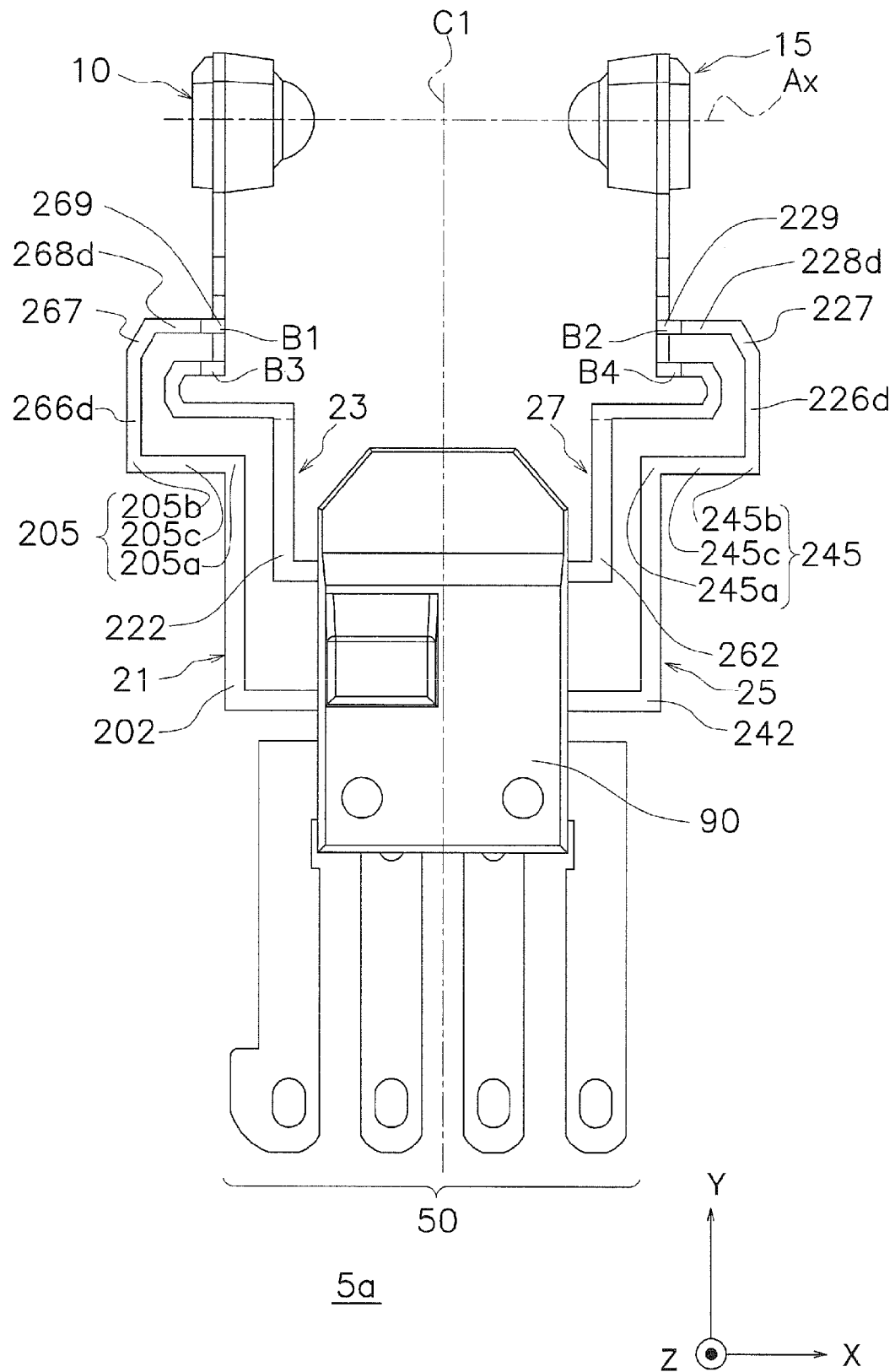
FIG. 16 is a plan view of a sensor module according to a modification.
Figure 17:
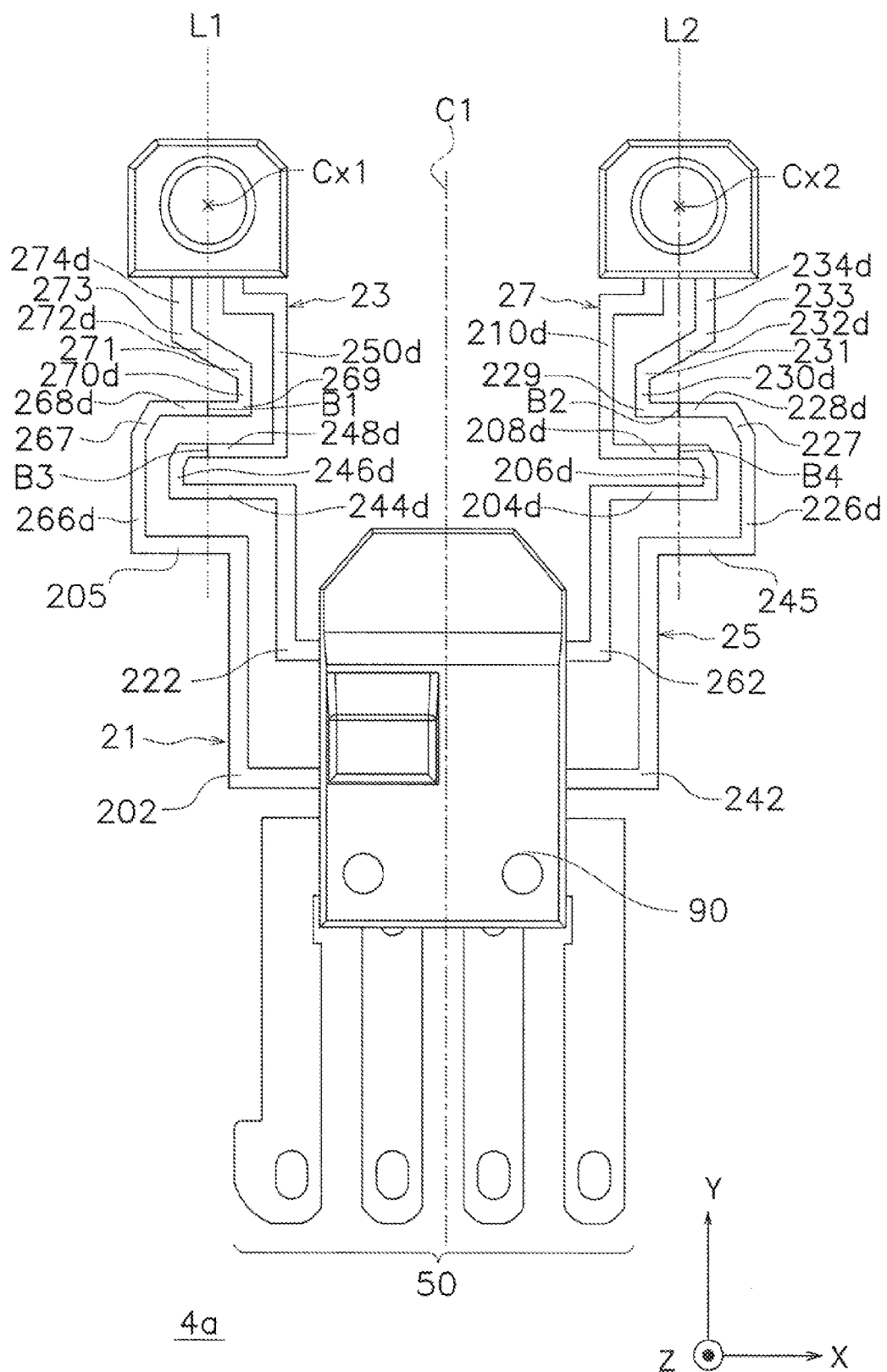
FIG. 17 is a plan view of a primary molded piece of the sensor module according to the modification.

FIG. 16 is a plan view of a sensor module 5a according to a modification. FIG. 17 is a plan view of a primary molded piece of the sensor module 5a shown in FIG. 16. In other words, FIG. 17 is an unfolded view of the sensor module 5a according to the modification in FIG. 16. The sensor module 5a unfolded in a plane shown in FIG. 17 is hereafter referred to as a sensor module 4a. In FIGS. 16 and 17, the components that are the same as the components shown in FIGS. 6 and 7 are given the same reference numerals as those components and will not be described.

Referring to FIGS. 16 and 17, the sensor module 5a includes a first emitter lead 21, a second emitter lead 23, a first receiver lead 25, and a second receiver lead 27. The first emitter lead 21, the second emitter lead 23, the first receiver lead 25, and the second receiver lead 27 are flat plates. The first emitter lead 21 and the second emitter lead 23 connect the light emitter 10 and the circuit-encapsulating portion 90. The first emitter lead 21 and the second emitter lead 23 are parallel to the first plane (XY) described above and protrude in the direction intersecting with the first direction (to the left, or in the negative direction of X axis) from the circuit-encapsulating portion 90. The first emitter lead 21 and the second emitter lead 23 extend in the direction opposite to the first direction (the positive direction of Y axis). The first receiver lead 25 and the second receiver lead 27 connect the light receiver 15 and the circuit-encapsulating portion 90. The first receiver lead 25 and the second receiver lead 27 are parallel to the first plane and protrude in the direction intersecting with the first direction and in the direction opposite to the direction in which the first emitter lead 21 and the second emitter lead 23 protrude (to the right, or in the positive direction of X axis) from the circuit-encapsulating portion 90. When, for example, the circuit-encapsulating portion 90 is a rectangular prism, the first and second receiver leads 25 and 27 protrude from the surface of the circuit-encapsulating portion 90 facing the surface from which the first and second receiver leads 21 and 23 protrude. These leads may protrude at any angles. The first and second emitter leads 25 and 27 extend in the direction opposite to the first direction (the positive direction of Y axis). The first and second emitter leads 21 and 23, and the first and second receiver leads 25 and 27 are deformed to allow the light emitter 10 and the light receiver 15 to face each other.

As shown in FIG. 16, the first emitter lead 21 includes a first emitter lead portion 202, a seventeenth emitter lead 205, an eighteenth emitter lead portion 266d, a thirteenth bending portion 267, a nineteenth emitter lead portion 268d, a fourteenth bending portion 269, a twenty emitter lead portion 270d, a fifteenth bending portion 271, a twenty first emitter lead portion 272d, a sixteenth bending portion 273, and a twenty second emitter lead portion 274d. The shapes of the components from the eighteenth emitter lead portion 266d to the twenty second emitter lead portion 274d are the same as the shapes of the corresponding components shown in FIG. 7, which are the components from the eighth receiver lead portion 266 to the eleventh receiver lead portion 272 in the figure. The first emitter lead portion 202 has the same shape as the first emitter lead portion 202 shown in FIG. 7. The first emitter lead portion 202 differs from the conventional emitter lead described above greatly in the seventeenth emitter lead 205. The seventeenth emitter lead 205 will now be described.

The seventeenth emitter lead 205 includes a fifth outer end 205b, a fifth inner end 205a, and a fifth straight portion 205c. The fifth inner end 205a joins the first emitter lead extension 202b and the fifth straight portion 204g. The fifth inner end 205a is bent. The fifth straight portion 204g extends outward in the optical axis direction (X-axis direction) from the fifth inner end 205a to the fifth outer end 205b. The fifth outer end 205b joins the fifth straight portion 205c and the eighteenth emitter lead portion 266d. The fifth outer end 205b is bent. The eighteenth emitter lead portion 266d is connected to the seventeenth emitter lead 205. More specifically, the eighteenth emitter lead portion 266d extends in the direction opposite to the first direction (the positive direction of Y axis) from the fifth outer end 205b to the thirteenth bending portion 267. Referring to FIG. 16, the nineteenth emitter lead portion 268d extends inward in the optical axis direction (X-axis direction) from the thirteenth bending portion 267. As shown in FIG. 16, the fifth inner end 205a is located more inward than the thirteenth bending portion 267 (corresponding to an outer end of the nineteenth emitter lead portion 268d) in the optical axis direction (X-axis direction). In the optical axis direction, the fourteenth bending portion 269 is located more inward than the fifth outer end 205b corresponding to an inner end of the nineteenth emitter lead portion 268d. This positional relationship results from the eighteenth emitter lead portion 266d arranged outward to allow the first bending portion B1 to have a sufficient margin for bending in the nineteenth emitter lead portion 268d.

Referring to FIGS. 16 and 17, the second emitter lead 23 is located more inward than the first emitter lead 21 in the optical axis direction (X-axis direction). The second emitter lead 23 includes a sixth emitter lead 222, a twenty third emitter lead portion 244d, a twenty fourth emitter lead portion 246d, a twenty fifth emitter lead portion 248d, and a twenty sixth emitter lead portion 250d. The shapes of the components from the twenty third emitter lead portion 244d to the twenty sixth emitter lead portion 250d are the same as the shapes of the corresponding components shown in FIG. 7, which are the components from the second receiver lead portion 244 to the fifth receiver lead portion 250 in the figure. The sixth emitter lead 222 has the same shape as the sixth emitter lead 222 shown in FIG. 7.

As shown in FIG. 16, the first receiver lead 24 includes a first receiver lead portion 242, a seventeenth receiver lead 245, an eighteenth receiver lead portion 226d, a fifth bending portion 227, a nineteenth receiver lead portion 228d, a sixth bending portion 229, a twenty receiver lead portion 230d, a seventh bending portion 231, a twenty first receiver lead 232d, an eighth bending portion 233, and a twenty second receiver lead 234d. The shapes of the components from the eighteenth receiver lead portion 226d to the twenty second receiver lead 234d are the same as the shapes of the corresponding components shown in FIG. 7, which are the components from the eighth emitter lead portion 226 to the twelfth emitter lead 234 in the figure. The first receiver lead 24 differs from the conventional receiver lead described above greatly in the seventeenth receiver lead 245. The seventeenth receiver lead 245 will now be described.

The seventeenth receiver lead 245 includes a sixth outer end 245b, a sixth inner end 245a, and a sixth straight portion 245c. The sixth inner end 245a joins the first emitter lead extension 242b and the sixth straight portion 245c. The sixth inner end 245a is bent. The sixth straight portion 245c extends outward in the optical axis direction (X-axis direction) from the sixth inner end 245a to the sixth outer end 245b. The sixth outer end 245b joins the sixth straight portion 245c and the eighteenth receiver lead portion 226d. The sixth outer end 245b is bent. The eighteenth receiver lead portion 226d is connected to the seventeenth receiver lead 245. More specifically, the eighteenth receiver lead portion 226d extends in the direction opposite to the first direction (the positive direction of Y axis) from the sixth outer end 245b to the fifth bending portion 227. The nineteenth receiver lead portion 228d extends inward in the optical axis direction (X-axis direction) from the fifth bending portion 227. As shown in FIG. 16, the sixth inner end 245a is located more inward than the fifth bending portion 227 corresponding to an outer end the nineteenth receiver lead portion 228d in the optical axis direction (X-axis direction). In the optical axis direction, the sixth bending portion 229 corresponding to an inner end of the nineteenth receiver lead portion 228d is located more inward than the sixth outer end 245b. This positional relationship results from the eighteenth receiver lead portion 226d arranged outward to allow the second bending portion B2 to have a sufficient margin for bending in the nineteenth receiver lead portion 228d.

Referring to FIGS. 16 and 17, the second receiver lead 27 is located more inward than the first receiver lead 25 in the optical axis direction (X-axis direction). The second receiver lead 27 includes a sixth receiver lead portion 262, a twenty third receiver lead portion 204d, a twenty fourth receiver lead portion 206d, a twenty fifth receiver lead portion 208d, and a twenty sixth receiver lead portion 210d. The shapes of the components from the twenty third receiver lead portion 204d to the twenty sixth receiver lead portion 210d are the same as the shapes of the corresponding components shown in FIG. 7, which are the components from the second emitter lead portion 204 to the fifth emitter lead portion 210 the eighth emitter lead portion 226 to the twelfth emitter lead 234 in the figure. The sixth emitter lead portion 262 has the same shape as the sixth receiver lead portion 262 shown in FIG. 7.

To shape the primary molded piece (sensor module 4a) of the sensor module 5 shown in FIG. 17 into the structure shown in FIG. 16 in which the light emitter 10 and the light receiver 15 face each other, the first emitter lead 21 and the second emitter lead 22 are bent along a first bending line L1. The first receiver lead 25 and the second receiver lead 27 are bent along a second bending line L2. The first bending line L1 is parallel to a second direction (Y-axis direction) that is perpendicular to the optical axis. The second bending line L2 is also parallel to the second direction (Y-axis direction). More specifically, the nineteenth emitter lead portion 268d includes the first bending portion B1, which is bent along the first bending line L1. The nineteenth receiver lead portion 228d includes the second bending portion B2, which is bent along the second bending line L2. The twenty fifth emitter lead portion 248d includes a third bending portion B3, which is bent along the first bending line L1. The twenty fifth receiver lead portion 208d includes a fourth bending portion B4, which is bent along the second bending line L2.

As shown in FIG. 17, when the first emitter lead 21 and the second emitter lead 23 are unfolded in a plane without bending along the first bending line L1, the unfolded first emitter lead 21 and the unfolded second emitter lead 23 extend across the first bending line L1. When the first receiver lead 25 and the second receiver lead 27 are unfolded in a plane without bending along the second bending line L2, the unfolded first receiver lead 25 and the unfolded second receiver lead 27 extend across the second bending line L2.

The first emitter lead portion 202, the sixth emitter lead 222, the first receiver lead portion 242, and the sixth receiver lead portion 262 have the same shapes. To allow deburring after the process of injection-molding the circuit-encapsulating portion 90, the emitter leads 20 and 22 and the receiver leads 24 and 26 are arranged away from the circuit-encapsulating portion 90 by a distance of about 0.3 to 0.4 mm. As shown in FIG. 16, the distance between the first emitter lead 21 and the second emitter lead 23 is apparently larger than the distance D2 in FIG. 6. The distance between the first emitter lead 21 and the second emitter lead 23 is set to prevent contact between and achieve insulation between them. Likewise, the distance between the first receiver lead 25 and the second receiver lead 27 is apparently larger than the distance D4 in FIG. 6. The distance between the first receiver lead 25 and the second receiver lead 27 is set to prevent contact between and achieve insulation between them. The first emitter lead 21, the second emitter lead 23, the first receiver lead 25, and the second receiver lead 27 are wide enough (e.g., not less than 0.5 mm) to have strength to bend and also to support the light emitter 10 and the light receiver 15. To have such strength, the first emitter lead 21, the second emitter lead 23, the first receiver lead 25, and the second receiver lead 27 are preferably formed from a copper alloy, gold, silver, or a nickel alloy. It is preferable that the first emitter lead 21, the second emitter lead 23, the first receiver lead 25, and the second receiver lead 27 satisfy the conditions 1 to 4 described above. This structure achieves the sensor module 5 in which the emitter and receiver leads protrude from the side of the circuit-encapsulating portion 90.

Figure 18:
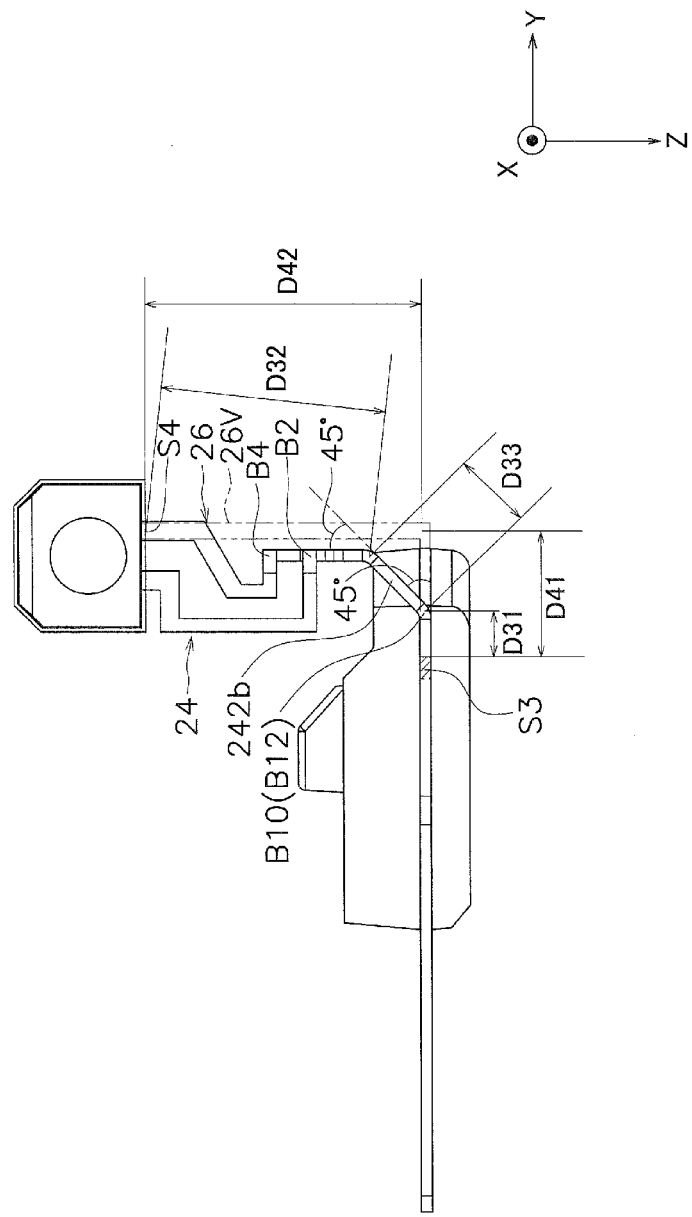
FIG. 18 is a side view of the sensor module including emitter and receiver leads bent into an L-shape as viewed in the optical axis direction.

The sensor module 4 shown in FIG. 7 changed to fit into an outer L-shaped type will now be described. Referring to FIG. 7, to change the module to fit into an outer L-shaped type, the first emitter lead 20, the second emitter lead 22, the first receiver lead 24, and the second receiver lead 26 are bent not only along the bending lines L1 and L2 but also along third and fourth bending lines L3 and L4. FIG. 18 is a side view of the sensor module including emitter and receiver leads bent into an L-shape as viewed in the optical axis direction. Referring to FIGS. 7 and 18, the first emitter lead 20, the second emitter lead 22, the first receiver lead 24, and the second receiver lead 26 are bent along the fourth bending line L4 at an angle of 45 degrees with respect to the first plane (XY plane). The first emitter lead 20, the second emitter lead 22, the first receiver lead 24, and the second receiver lead 26 include bending portions B6, B8, B10, and B12, which are bent along the fourth bending line L4. The first emitter lead 20, the second emitter lead 22, the first receiver lead 24, and the second receiver lead 26 are bent along the third bending line L3 at an angle of 45 degrees with respect to the first emitter lead 20, the second emitter lead 22, the first receiver lead 24, and the second receiver lead 26, which are bent along the fourth bending line L4. The first emitter lead 20, the second emitter lead 22, the first receiver lead 24, and the second receiver lead 26 include bending portions B5, B7, B9, and B11, which are bent along the third bending line L3. More specifically, the first emitter lead 20, the second emitter lead 22, the first receiver lead 24, and the second receiver lead 26 bent along the third bending line L3 are perpendicular to the first plane (XY plane). The sensor module bent into an outer L-shaped type shown in FIG. 18 will be hereafter referred to as a sensor module 6.

A section including the bending portions B5 and B6, a section including the bending portions B7 and B8, a section including the bending portions B9 and B10, and a section including the bending portions B11 and B12 are each referred to as a direction changing section. In particular, a section including the bending portions B7 and B8 of the second emitter lead 22 is referred to as a first direction changing section. A section including the bending portions B11 and B12 of the second receiver lead 26 is referred to as a second direction changing section.

The shape characteristics of the outer L-shaped type will now be described focusing on the second emitter lead 22 and the second receiver lead 26. The sixth receiver lead portion 262 includes a sixth receiver lead protrusion 262a, which extends from the circuit-encapsulating portion 90 in the optical axis direction (X-axis direction), and extends on the first plane (XY plane) described above from the circuit-encapsulating portion 90. The sixth receiver lead portion 262 includes a sixth receiver extension 262b, which extends on the first plane in the direction perpendicular to the optical axis direction (the positive direction of Y axis). This structure allows the second receiver lead 26 to protrude from the side surface of the circuit-encapsulating portion 90, and thus the second receiver lead 26 can be bent along the bending line L4. The sixth receiver lead portion 262 may be referred to as a first receiver base lead, and the sixth receiver extension 262b may be referred to as a first receiver straight lead.

The eighth receiver lead portion 266 extends on a second plane (XZ plane) perpendicular to the first plane in the direction perpendicular to the optical axis direction (the positive direction in Z axis). The seventh receiver lead portion 264 joins the sixth receiver lead portion 262 and the eighth receiver lead portion 266. The eighth receiver lead portion 266 may be referred to as a second receiver base lead, or as a second receiver straight lead. The seventh receiver lead portion 264 may be referred to as a receiver connection lead.

The sixth receiver extension 262b includes a bending portion B12 that is bent along the fourth bending line L4. More specifically, the sixth receiver extension 262b is bent. The eighth receiver lead portion 266 includes a bending portion B11 that is bent along the third bending line L3. The eighth receiver lead portion 266 is bent. The sixth receiver extension 262b and the eighth receiver lead portion 266 are both linear. Such lead portions are bent and thus allow easy bending. Referring to FIG. 18, the second receiver lead 26 is bent in the sixth receiver extension 262b at an angle of 45 degrees, and bent in the eighth receiver lead portion 266 at an angle of 45 degrees. The total angle by which the sixth receiver extension 262b is bent and the eighth receiver lead portion 266 is bent is 90 degrees. The second receiver lead 26 may not be bent at two positions each at an angle of 45 degrees as shown in FIG. 18, but may be bent at three or more points in a manner to achieve the total bending angle of 90 degrees. Alternatively, the second receiver lead 26 may be bent in a curve so that the unbent surface and the bent surface form an angle of 90 degrees.

The second receiver lead 26 extends from its third base S3, which is on the surface of the circuit-encapsulating portion 90, to its fourth base S4, which is on the surface of the light emitter 10. The second receiver lead 26 includes a second direction changing section between the third base S3 and the fourth base S4. The second direction changing section changes the direction in which the second receiver lead 26 extends from the first plane (XY plane) to the direction perpendicular to the first plane. The second receiver lead 26 is bent at multiple points between the third base S3 and the fourth base S4. Referring to FIG. 18, the length of the second receiver lead 26 from the third base S3 and the second direction changing section to the fourth base S4 as viewed in the optical axis direction (X-axis direction) is defined by the total of a straight-line distance D31 from the third base S3 to the second direction changing section (bending portion B12) viewed in the optical axis direction (X-axis direction), a straight-line distance D32 from the second direction changing section (bending portion B11) to the fourth base S4 viewed in the optical axis direction, and a straight-line distance D33 between one end of the second direction changing section in contact with a portion of the second receiver lead 26 extending from the third base S3 and the other end of the second direction changing section in contact with a portion of the second receiver lead 26 extending to the fourth base S4 viewed in the optical axis direction. The length of the second receiver lead 26 extending from the third base S3 and the second direction changing section to the fourth base S4 as viewed in the optical axis direction is smaller than the length (D41+D42) of an L-shaped second virtual lead 26v (indicted by a chain double-dashed line in FIG. 18) that is bent at one point by 90 degrees between the third base S3 and the fourth base S4 viewed in the optical axis direction.

Referring to FIG. 7, the sixth emitter lead 222 includes a sixth emitter lead protrusion 222a, which extends from the circuit-encapsulating portion 90 in the optical axis direction (X-axis direction), and extends on the first plane (XY plane) from the circuit-encapsulating portion 90. The sixth emitter lead 222 includes a sixth emitter lead extension 222b, which extends on the first plane in the direction perpendicular to the optical axis direction (the positive direction of Y axis). This structure allows the second emitter lead 22 to protrude from the side surface of the circuit-encapsulating portion 90, and thus the second emitter lead 22 can be bent along the bending line L4. The sixth emitter lead 222 may be referred to as a first emitter base lead, and the sixth emitter lead extension 222*b* may be referred to as a first emitter straight lead.

The eighth emitter lead portion 226 extends on a second plane (XZ plane) perpendicular to the first plane in the direction perpendicular to the optical axis direction (the positive direction in Z axis). The seventh emitter lead portion 224 connects the sixth emitter lead 222 and the eighth emitter lead portion 226. The eighth emitter lead portion 226 may be referred to as a second emitter base lead, or as a second emitter straight lead. The seventh emitter lead portion 224 may be referred to as an emitter connection lead.

The sixth emitter lead extension 222*b* includes a bending portion B8 that is bent along the fourth bending line L4. More specifically, the sixth emitter lead extension 222*b* is bent. The eighth emitter lead portion 226 includes a bending portion B7 that is bent along the third bending line L3. The eighth emitter lead portion 226 is bent. The sixth emitter lead extension 222*b* and the eighth emitter lead portion 226 are both linear. Such lead portions are bent and thus allow easy bending. The second emitter lead 22 is bent in the sixth emitter lead extension 222*b* at an angle of 45 degrees, and bent in the eighth emitter lead portion 226 at an angle of 45 degrees. The total angle by which the sixth emitter lead extension 222*b* is bent and the eighth emitter lead portion 226 is bent is 90 degrees. The second emitter lead 22 may not be bent at two points each at an angle of 45 degrees as shown in FIG. 18, but may be bent at three or more points in a manner to achieve the total bending angle of 90 degrees. Alternatively, the second emitter lead 22 may be bent in a curve so that the unbent surface and the bent surface form an angle of 90 degrees.

The second emitter lead 22 extends from its first base S1, which is on the surface of the circuit-encapsulating portion 90, to its second base S2 (refer to FIG. 7), which is on the surface of the light emitter 10. The second emitter lead 22 includes a second direction changing section between the first base S1 and the second base S2. The second direction changing direction changes the direction in which the second emitter lead 22 extends from the first plane (XY plane) to the direction perpendicular to the first plane. The second emitter lead 22 is bent at multiple points between the first base and the second base. The length of the second emitter lead 22 from the first base S1 and the first direction changing section to the second base S2 as viewed in the optical axis direction (X-axis direction) is defined by the total of a straight-line distance from the first base S1 to the first direction changing section (bending portion B6) viewed in the optical axis direction (X-axis direction), a straight-line distance from the first direction changing section (bending portion B6) to the second base S2 viewed in the optical axis direction, and a straight-line distance between one end of the first direction changing section in contact with a portion of the second emitter lead 22 extending from the first base S1 and the other end of the first direction changing section in contact with a portion of the second emitter lead 22 extending to the second base S2 viewed in the optical axis direction. The length of the second emitter lead 22 extending from the first base S1 and the first direction changing section to the second base S2 as viewed in the optical axis direction is smaller than the length (D41+D42) of an L-shaped first virtual lead bent at one point by 90 degrees between the first base S1 and the second base S2 viewed in the optical axis direction. This allows the single sensor module 4 to be bent to fit into a flat (straight) type or an outer L-shaped type. FIG. 18 is a left side view of the sensor module, and does not show the second emitter lead 22. As described above, the second emitter lead 22 is symmetric to the second receiver lead 26 with respect to the plane C1 (refer to FIG. 6). Thus, the second emitter lead 22 is bent in the same manner as shown in FIG. 18. Further, the first virtual lead has the same shape as the second virtual lead 26*v*.

In this manner, bending the first emitter lead 20, the second emitter lead 22, the first receiver lead 24, and the second receiver lead 26 enables the free setting of the Z-axis distance between the light emitter 10 and the circuit-encapsulating portion 90, and the Z-axis distance between the light receiver 15 and the circuit-encapsulating portion 90. This increases the degree of freedom in designing the outer shape of the photosensor 1 (optical axis Ax).

Case for Sensor Module

Figure 19:
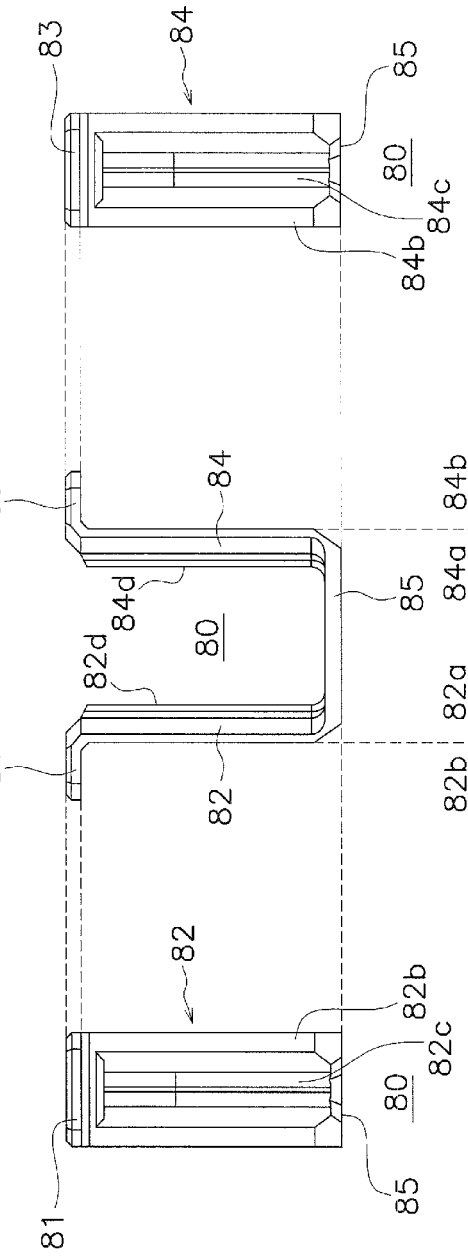
FIGS. 19A to 19D are detailed views of a subcase.

A case for encasing the sensor module 5 will now be described. When the sensor module 5 is placed in the case 60, the subcase 80 is also used. The subcase 80 guides the light emitter 10 and the light receiver 15 when the sensor module 5 is placed into the case 60, and prevents the first emitter lead 20, the second emitter lead 22, the first receiver lead 24, and the second receiver lead 26 from coming in contact with the inner wall of the case 60 and being deformed. FIG. 19A is a front view of the subcase 80. FIG. 19B is a bottom view of the subcase 80. FIG. 19C is a left side view of the subcase 80. FIG. 19D is a right side view of the subcase 80.

As shown in FIG. 4, the case 60 accommodates the light emitter 10, the first emitter lead 20, the second emitter lead 22, the light receiver 15, the first receiver lead 24, and the second receiver lead 26 of the sensor module 5, and the subcase 80. The case body 61 accommodates the circuit-encapsulating portion 90. The emitter case section 62 accommodates the light emitter 10, the first emitter lead 20, and the second emitter lead 22. The receiver case section 63 accommodates the light receiver 15, the first receiver lead 24, and the second receiver lead 26. The circuit-encapsulating portion 90 is supported on the base plate 98. The base plate 98 is engaged with a part of the case body 61 and is fixed.

The subcase 80 includes a first top plate 81, a second top plate 83, a first wall portion 82, a second wall portion 84, and a base plate portion 85. The subcase 80 is formed from a material that allows light with a specific frequency (e.g., infrared light) emitted from the emitter element 11 to pass through. The first wall portion 82 extends perpendicularly from one end of the base plate portion 85. The second wall portion 84 extends perpendicularly from the other end of the base plate portion 85 and in the same direction as the direction in which the first wall portion 82 extends. In other words, the base plate portion 85 joins the first wall portion 82 and the second wall portion 84. The direction in which the first wall portion 82 and the second wall portion 84 from the base plate portion 85 is referred to as a third direction. The first top plate 81 extends in a first outward direction from the top end of the first wall portion 82 in the third direction. The top end of the first wall portion 82 in the third direction is located opposite to the basal end of the first wall portion 82 in the third direction, which is in contact with the base plate portion 85. The first outward direction refers to a direction from the basal end of the second wall portion 84 toward the basal end of the first wall portion 82 in the third direction. The second top plate 83 extends in a second outward direction from the top end of the second wall portion 84 opposite to the basal end of the second wall portion 84 in the third direction, which is in contact with the base plate portion 85. The second outward direction refers to a direction from the basal end of the first wall portion 82 toward the basal end of the second wall portion 84. The first top plate 81, the second top plate 83, and the base plate portion 85 are parallel to each other. The first wall portion 82 is parallel to the second wall portion 84.

As shown in FIGS. 4 and 5, the first top plate 81 and the first wall portion 82 are placed into the emitter case section 62. The second top plate 83 and the second wall portion 84 are placed into the receiver case section 63. Referring to FIG. 5, the first wall portion 82 comes in contact with a first inner wall surface 64a of the emitter case section 62 facing the light emitter 10. The second wall portion 84 comes in contact with a second inner wall surface 65a of the receiver case section 63 facing the light receiver 15. Referring to FIG. 4, an end 81a of the first top plate 81 facing in the direction opposite to the direction in which light from the light emitter 10 travels (the negative direction of X axis) comes in contact with the third inner wall surface 64b of the emitter case section 62 facing the first inner wall surface 64a. An end 83a of the second top plate 83 facing in the direction in which the light travels (the positive direction of X axis) comes in contact with the fourth inner wall surface 65b of the receiver case section 63 facing the second inner wall surface 65a. The end 81a and the end 83a may not be flat, but may have protrusions or may be sharp. The third inner wall surface 64b extends from the inside of the emitter case section 62 to the basal end of the case body 61. The fourth inner wall surface 65b extends from the inside of the receiver case section 63 to the basal end of the case body 61. This structure allows the subcase 80 to be placed into the case 60 while allowing the subcase 80 to slide on the first inner wall surface 64a, the second inner wall surface 65a, the third inner wall surface 64b, and the fourth inner wall surface 65b of the case 60. This achieves smooth placement of the subcase 80 into the case 60. This structure also prevents the first wall portion 82 and the second wall portion 84 from touching the inner wall surface of the case 60 and being deformed when the subcase 80 is placed into the case 60. The subcase 80 and the case 60 with the structures described above allow the subcase 80 to be easily placed by using a machine.

As shown in FIG. 4, the first top plate 81 faces the fifth inner wall surface 64c of the emitter case section 62 facing the case body 61. In other words, the first top plate 81 faces the case body 61. Further, the second top plate 83 faces the sixth inner wall surface 65c of the receiver case section 63 facing the case body 61. In other words, the second top plate 83 faces the case body 61. When the subcase 80 is placed into the case 60 by using a machine, the machine may detect a pressure generated when the first top plate 81 comes in contact with the fifth inner wall surface 64c and the second top plate 83 comes in contact with the sixth inner wall surface 65c. This allows the machine to detect that the subcase has been placed completely, and allows easier placement of the subcase by using a machine.

Referring to FIGS. 19B and FIG. 5, the first wall portion 82 includes a first wall surface 82a, a second wall surface 82b, a first groove 82c, and a first protrusion 82d. The first wall surface 82a comes in contact with the first inner wall surface 64a. The second wall surface 82b is opposite to the first wall surface 82a. The first groove 82c is arranged on the second wall surface 82b, and comes in contact with a part of the emitter lens 14. The first protrusion 82d is arranged on the first wall surface 82a, and protrudes in the direction toward the second wall portion 84. The first protrusion 82d protrudes in conformance with the recess of the first groove 82c.

Referring to FIGS. 19B and FIG. 5, the second wall portion 84 includes a third wall surface 84a, a fourth wall surface 84b, a second groove 84c, and a second protrusion 84d. The third wall surface 84a comes in contact with the second inner wall surface 65a. The fourth wall surface 84b is opposite to the third wall surface 84a. The second groove 84c is arranged on the fourth wall surface 84b, and comes in contact with a part of the emitter lens 14. The second protrusion 84d is arranged on the third wall surface 84a, and protrudes in the direction toward the first wall portion 82. The second protrusion 84d protrudes in conformance with the recess of the second groove 84c.

When the sensor module 5 is placed in the case 60 encasing the subcase 80, the emitter lens 14 slides on the first groove 82c, and the receiver lens 19 slides on the second groove 84c. Mechanically placing the sensor module 5 can allow the optical axis of the light emitter 10 and the optical axis of the light receiver 15 to be aligned with each other. The positions of the light emitter 10 and the light receiver 15 are fixed on the first groove 82c and the second groove 84c. This structure prevents large misalignment between the optical axes of the emitter lens 14 and the receiver lens 19 when, for example, the photosensor 1 receives vibrations.

As shown in FIG. 5, the first protrusion 82d is engaged with the emitter slit 66, and the second protrusion 84d is engaged with the receiver slit 67. The emitter slit 66 and the receiver slit 67 each function as a guide in placing the subcase 80 into the case 60. This further facilitates the operation of placing the subcase 8 into the case 60.

As shown in FIGS. 4 and 5, the subcase 80 includes the first top plate 81, the second top plate 83, the first wall portion 82, and the second wall portion 84 covering the top of the light emitter 10 and the light receiver 15, and covering the right side and the upper side of the emitter lens 14 of the light emitter 10 and the left side and the upper side of the receiver lens 19 of the light receiver 15 from which light is emitted and received. This structure reduces static electricity that can be generated around the emitter case section 62 and the receiver case section 63 affecting the emitter element 11, the receiver element 16, the first emitter lead 20, the second emitter lead 22, the first receiver lead 24, and the second receiver lead 26.

Figure 20:
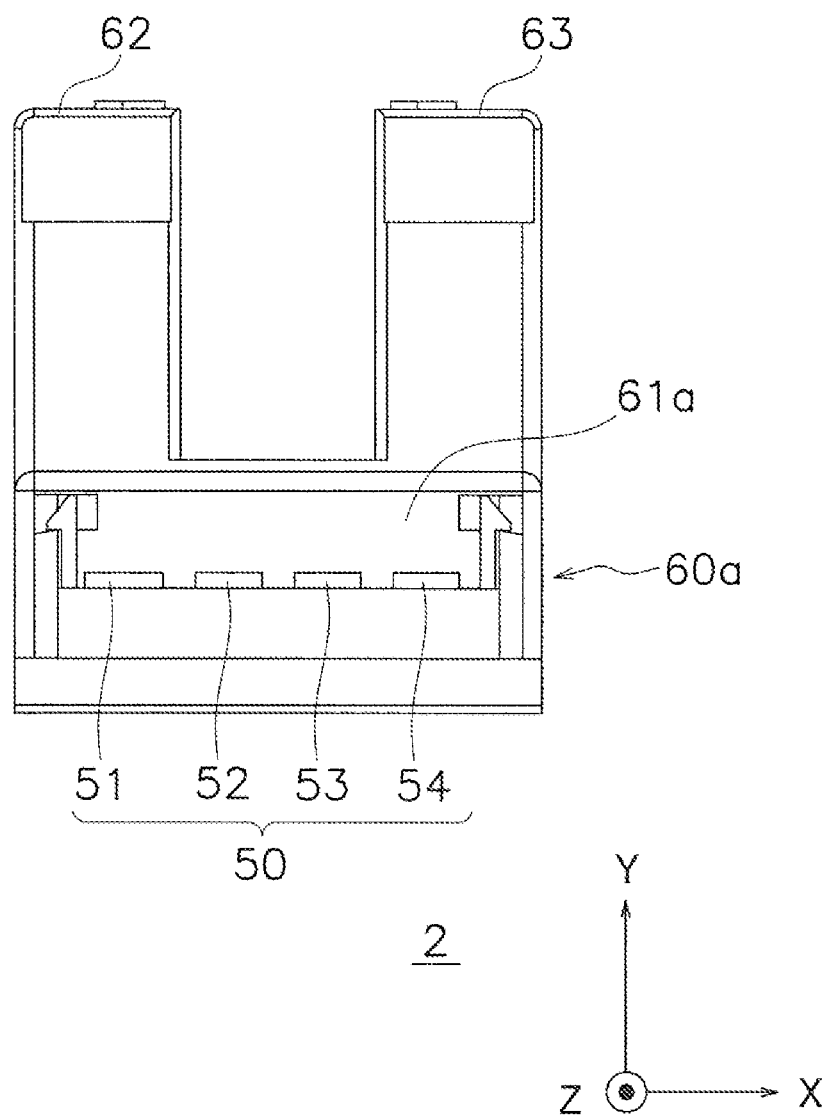
FIG. 20 is a front view of a photosensor according to another embodiment.
Figure 21:
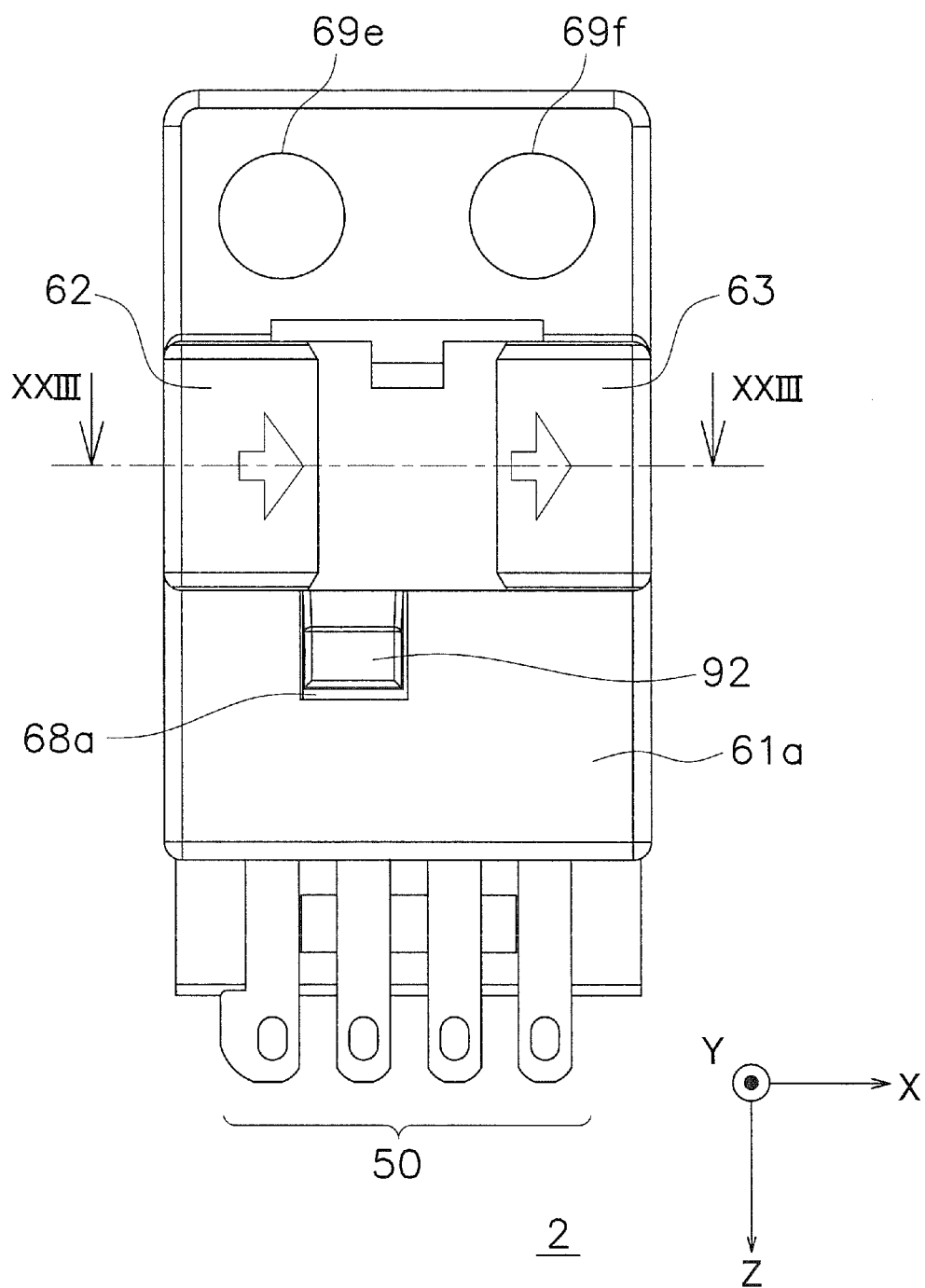
FIG. 21 is a top view of the photosensor according to the other embodiment.
Figure 22:
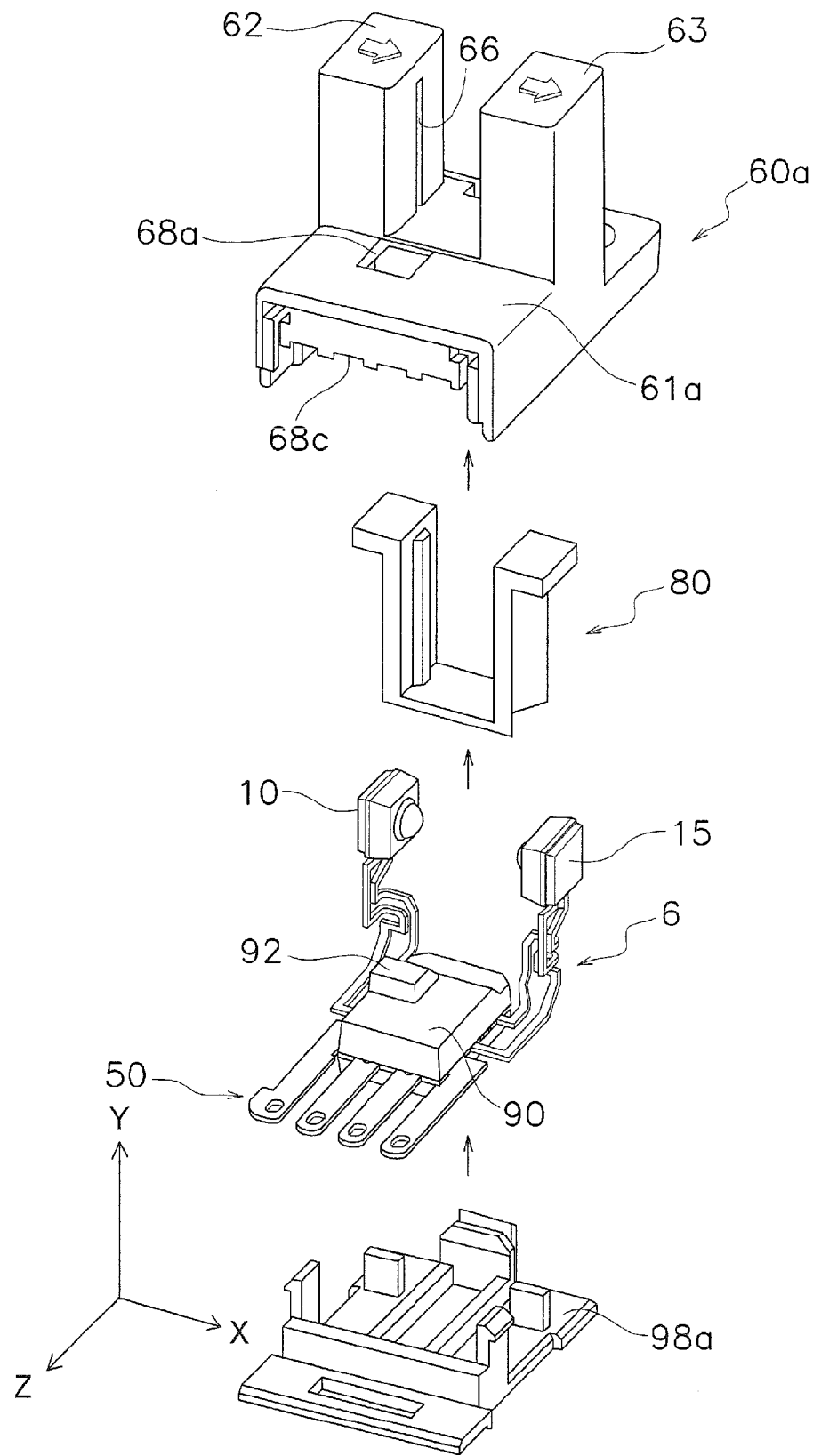
FIG. 22 is an exploded perspective view of the photosensor according to the other embodiment.

The case for encasing an outer L-shaped type also uses the subcase 80. FIG. 20 is a front view of an outer L-shaped photosensor 2. FIG. 21 is a top view of the outer L-shaped photosensor 2. FIG. 22 is an exploded perspective view of the outer L-shaped photosensor 2. In FIGS. 20 to 22, the components that are the same as the components shown in FIGS. 1 to 3 are given the same reference numerals as those components and will not be described.

As shown in FIGS. 20 to 22, the photosensor 2 differs from the photosensor 1 in the shape of its case 60a. The case 60a includes an emitter case section 62 and a receiver case section 63 that are the same as in the case 60. The photosensor 2 thus has all the characteristics described above associated with the subcase 80, the emitter case section 62, and the receiver case section 63. The characteristics of the case associated with the subcase 80, the emitter case section 62, and the receiver case section 63 will not be described.

The case 60a includes a case body 61a with a shape different from the case body 61. As shown in FIG. 21, the case body 60a includes an indicator lamp window 68 as an opening in the front. The indicator lamp window 68 allows visual checking of an operation indicator 92. The case body 60a has mounting holes 69a and 69b in the direction perpendicular to the direction in which the emitter and receiver slits face each other (Y-axis direction in FIG. 21). The holes 69a and 69b are formed through the case 60. The photosensor 2 includes connecting terminals 50, which are a part of the sensor module 5. The connecting terminals 50 protrude frontward from the case 60a. As shown in FIG. 22, the subcase 80 and the sensor module 6 are placed into the case 60a in this order. A base plate 98a for supporting the circuit-encapsulating portion 90 is then attached to the bottom of the case 60a.

Figure 23:
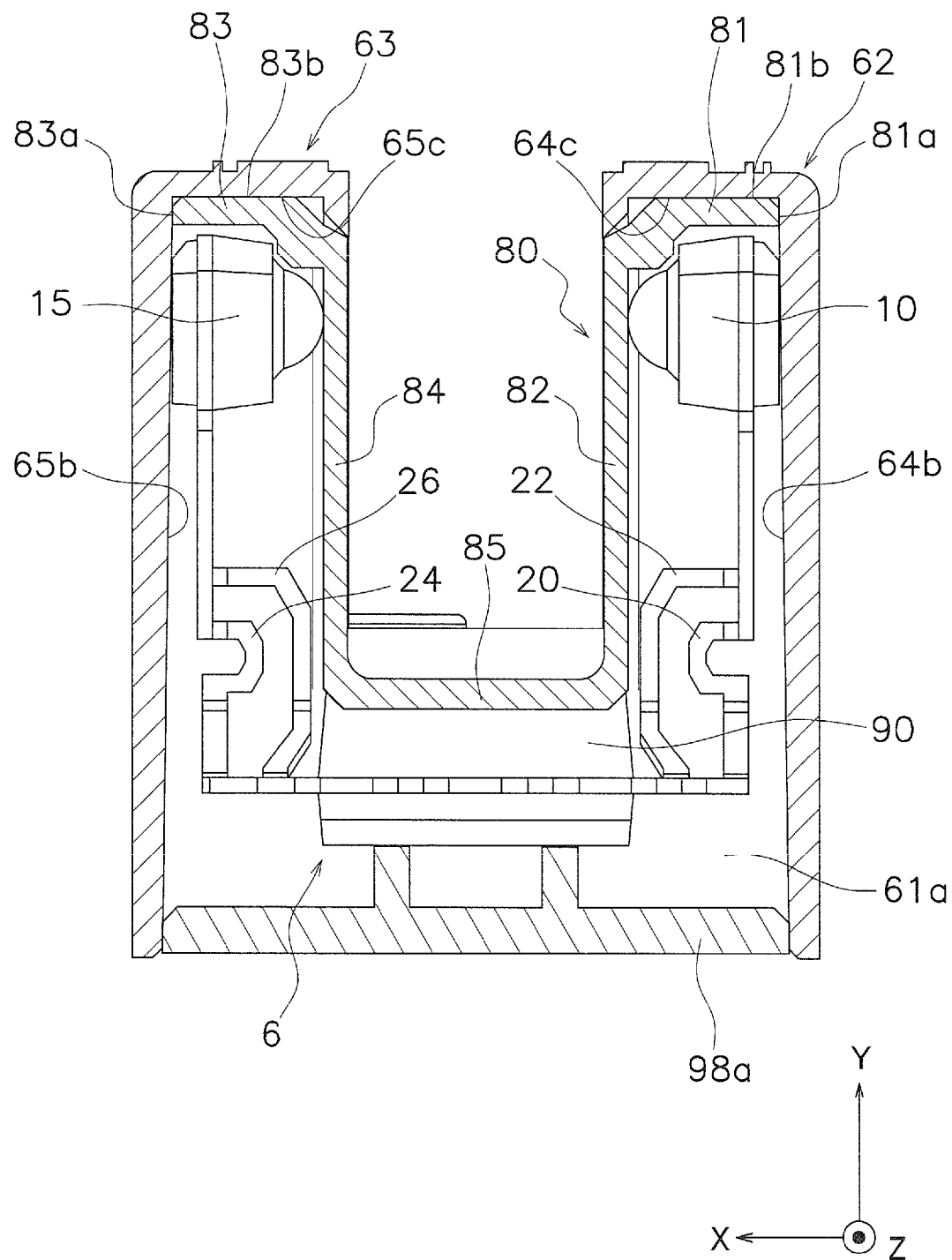
FIG. 23 is a cross-sectional view of the photosensor taken along line XXIII-XXIII in FIG. 21.

FIG. 23 is a cross-sectional view of the photosensor 2 taken along line XXIII-XXIII of FIG. 21. With reference to FIG. 23, the characteristics of the inside of the case body 61a will be described. First, the third inner wall surface 64b extends from the inside of the emitter case section 62 to the basal end of the case body 61a. The fourth inner wall surface 65b extends from the inside of the receiver case section 63 to the basal end of the case body 61a. The circuit-encapsulating portion 90 is supported by the base plate 98a. The circuit-encapsulating portion 90 comes in contact with the base plate portion 85 of the subcase 80 and supports the base plate portion 85.

Although the embodiment of the present invention has been described, the invention should not be limited to the above embodiment. Various modifications are possible without departing from the scope and spirit of the invention.

The position of the light emitter 10 and the position of the light receiver 15 may be reversed. When the positions of the light emitter 10 and the light receiver 15 are reversed, the position of the first emitter lead 20 and the position of the first receiver lead 24 are reversed, and the position of the second emitter lead 22 and the position of the second receiver lead 26 are reversed in accordance with the positions of the light emitter 10 and the light receiver 15. The position of the emitter case section 62 and the position of the receiver case section 63 are also reversed accordingly.

The emitter lens 14 and the receiver lens 19 may not be circular. For example, the emitter lens 14 and the receiver lens 19 may be oval. The emitter-encapsulating portion 12 may not have the emitter end 13, and the emitter lens 14 may encapsulate the emitter element 11. The receiver-encapsulating portion 17 may not have the receiver end 18, and the receiver lens 19 may encapsulate the receiver element 16.

The number of connecting terminals may not be four. The sensor modules 4, 5, and 6 may include more than four or less than four connecting terminals. The sensor modules 4, 5, and 6 may not include the operation indicator 92.

INDUSTRIAL APPLICABILITY

The photosensor of the present invention simplifies the resin molding process for an emitter element, a receiver element, and a luminous element forming an operation indicator lamp.

REFERENCE SIGNS LIST 8 leadframe
11 emitter element
12 emitter-encapsulating portion
17 receiver-encapsulating portion
16 receiver element
17 receiver-encapsulating portion
40 circuit portion
42 luminous element
90 circuit-encapsulating portion
92 operation indicator

The invention claimed is:
1. A photosensor, comprising:
an emitter element;
an emitter-encapsulating portion encapsulating the emitter element;
a receiver element;
a receiver-encapsulating portion encapsulating the receiver element;
a circuit portion including a luminous element for indicating an operation; and
a circuit-encapsulating portion encapsulating the circuit portion and including an operation indicator portion facing the luminous element,
wherein the emitter-encapsulating portion, the receiver-encapsulating portion, and the circuit-encapsulating portion are connected to one another with a conductive leadframe, and are formed from the same resin material containing a light diffusing agent,
wherein the resin has a light transmittance of not less than 20% and not more than 60%.

2. The photosensor according to claim 1, wherein the leadframe is formed integrally.

3. The photosensor according to claim 1, wherein the emitter-encapsulating portion includes an emitter base and an emitter lens.

4. The photosensor according to claim 1, wherein the receiver-encapsulating portion includes a receiver base and a receiver lens.

5. A photosensor, comprising:
an emitter element;
an emitter-encapsulating portion encapsulating the emitter element;
a receiver element;
a receiver-encapsulating portion encapsulating the receiver element;
a circuit portion including a luminous element for indicating an operation; and
a circuit-encapsulating portion encapsulating the circuit portion and including an operation indicator portion facing the luminous element,
wherein the thickness of a resin portion of the receiver-encapsulating portion covering a light receiving surface of the receiver element in a direction perpendicular to the light receiving surface is smaller than the thickness of a resin portion of the circuit-encapsulating portion covering a luminous surface of the luminous element in a direction perpendicular to the luminous surface.

6. The photosensor according to claim 5, wherein
a surface of the receiver-encapsulating portion facing the light receiving surface includes a curved surface,
the thickness of a resin portion of the receiver-encapsulating portion between the light receiving surface of the receiver element and an apex of the curved surface is smaller than the thickness of a resin portion of the circuit-encapsulating portion covering the luminous surface of the luminous element in a direction perpendicular to the luminous surface.

7. A photosensor, comprising:
an emitter element;
an emitter-encapsulating portion encapsulating the emitter element;
a receiver element;
a receiver-encapsulating portion encapsulating the receiver element;
a circuit portion including a luminous element for indicating an operation; and
a circuit-encapsulating portion encapsulating the circuit portion and including an operation indicator portion facing the luminous element,
wherein the emitter-encapsulating portion, the receiver-encapsulating portion, and the circuit-encapsulating portion are connected to one another with a conductive leadframe, and are formed from the same resin material containing a light diffusing agent, and wherein the thickness of a resin portion of the emitter-encapsulating portion covering a light emitting surface of the emitter element in a direction perpendicular to the light emitting surface is smaller than the thickness of a resin portion of the circuit-encapsulating portion covering a luminous surface of the luminous element in a direction perpendicular to the luminous surface.

8. The photosensor according to claim 7, wherein
a surface of the emitter-encapsulating portion facing the light emitting surface includes a curved surface,
the thickness of a resin portion of the emitter-encapsulating portion between the light emitting surface of the emitting element and an apex of the curved surface is smaller than the thickness of a resin portion of the circuit-encapsulating portion covering the luminous surface of the luminous element in a direction perpendicular to the luminous surface.

\* \* \* \* \*